(12) United States Patent
Jeon et al.

(10) Patent No.: US 11,703,963 B2
(45) Date of Patent: Jul. 18, 2023

(54) INPUT DEVICE

(71) Applicant: Panasonic Intellectual Property Management Co., Ltd., Osaka (JP)

(72) Inventors: Sohui Jeon, Osaka (JP); Kota Araki, Osaka (JP); Hiroaki Nishiono, Osaka (JP); Satoshi Yoshihara, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/622,081

(22) PCT Filed: Jun. 23, 2020

(86) PCT No.: PCT/JP2020/024636
§ 371 (c)(1),
(2) Date: Dec. 22, 2021

(87) PCT Pub. No.: WO2020/262390
PCT Pub. Date: Dec. 30, 2020

(65) Prior Publication Data
US 2022/0317783 A1  Oct. 6, 2022

(30) Foreign Application Priority Data

Jun. 28, 2019  (JP) ................. 2019-121358

(51) Int. Cl.
*G06F 3/0362* (2013.01)
(52) U.S. Cl.
CPC ................. *G06F 3/0362* (2013.01)

(58) Field of Classification Search
CPC ............. G06F 3/0362; G06F 3/044–0448
See application file for complete search history.

(56) References Cited

U.S. PATENT DOCUMENTS

| 2010/0200384 A1 | 8/2010 | Tsuduki | |
|---|---|---|---|
| 2017/0316901 A1* | 11/2017 | Sawada | H01H 19/02 |
| 2017/0334083 A1* | 11/2017 | Gratsias | B26B 21/521 |

FOREIGN PATENT DOCUMENTS

WO  2016/075907 A1  5/2016

OTHER PUBLICATIONS

Extended European Search Report dated Jul. 7, 2022 issued in the corresponding European Patent Application No. 20832068.9.
(Continued)

*Primary Examiner* — Hang Lin
(74) *Attorney, Agent, or Firm* — McDermott Will & Emery LLP

(57) ABSTRACT

An input device includes: a first electrode; a support body that supports the first electrode; a fixed body fixed above the support body; a second electrode; a movable body that holds the second electrode in a state where the second electrode faces the first electrode with a predetermined space being provided therebetween, and causes the second electrode to approach and recede from the first electrode in a movement direction by rotating; an operation body that is fixed movably relative to the fixed body in a state where the operation body is engaged with the movable body, and causes, by being operated by a user, the movable body to rotate; and a biasing part that is disposed between the movable body and the fixed body, and applies, to the movable body, a biasing force toward the support body.

11 Claims, 17 Drawing Sheets

(56) References Cited

OTHER PUBLICATIONS

International Search Report and Written Opinion dated Sep. 29, 2020 in International Patent Application No. PCT/JP2020/024636; with partial English translation.

* cited by examiner (a) First state (b) Second state (a)

(b)

(c)

(d)

US 11,703,963 B2

INPUT DEVICE

CROSS-REFERENCE OF RELATED APPLICATIONS

This application is the U.S. National Phase under 35 U.S.C. § 371 of International Patent Application No. PCT/JP2020/024636, filed on Jun. 23, 2020, which in turn claims the benefit of Japanese Application No. 2019-121358, filed on Jun. 28, 2019, the entire disclosures of which Applications are incorporated by reference herein.

TECHNICAL FIELD

The present disclosure relates to an input device.

BACKGROUND ART

Conventionally, as an example of an rotational operation type input device, an input device has been known which includes a first electrode, a second electrode facing and spaced apart from the first electrode, and a third electrode that is spaced apart from the first electrode, is rotatable with respect to the second electrode, and changes an electrical state between the first electrode and the second electrode by being brought into contact with or separated from the second electrode (for example, see Patent Literature (PTL) 1).

CITATION LIST

Patent Literature

[PTL 1] International Publication WO2016/075907

SUMMARY OF INVENTION

Technical Problem

In recent years, an input device has been examined which causes a second electrode to move by rotation or translation relative to a first electrode in a state in which the first electrode and the second electrode face each other with a predetermined space being provided therebetween, to change an electrical state between the second electrode and the first electrode without using a third electrode. Here, if the space between the first electrode and the second electrode increases during relative movement, a change in the electrical state becomes unstable and sensitivity decreases.

An object of the present disclosure is to provide an input device that can maintain sensitivity to a change in an electrical state by maintaining the space between the first electrode and the second electrode constant during relative movement.

Solution to Problem

An input device according to an aspect of the present disclosure includes: a first electrode; a support body that supports the first electrode; a fixed body fixed above the support body; a second electrode; a movable body that holds the second electrode in a state in which the second electrode faces the first electrode with a predetermined space being provided therebetween, the movable body causing the second electrode to approach and recede from the first electrode by moving by rotation or translation; an operation body held by the fixed body movably relative to the fixed body in a state in which the operation body is engaged with the movable body, the operation body causing, by being operated by a user, the movable body to move by rotation or translation; and a biasing part that is disposed between the movable body and the fixed body, and applies, to the movable body, a biasing force toward the support body.

Advantageous Effects of Invention

An input device according to the present disclosure can maintain sensitivity to a change in an electrical state by maintaining the space between a first electrode and a second electrode constant during relative movement.

DESCRIPTION OF EMBODIMENTS

Figure 1:
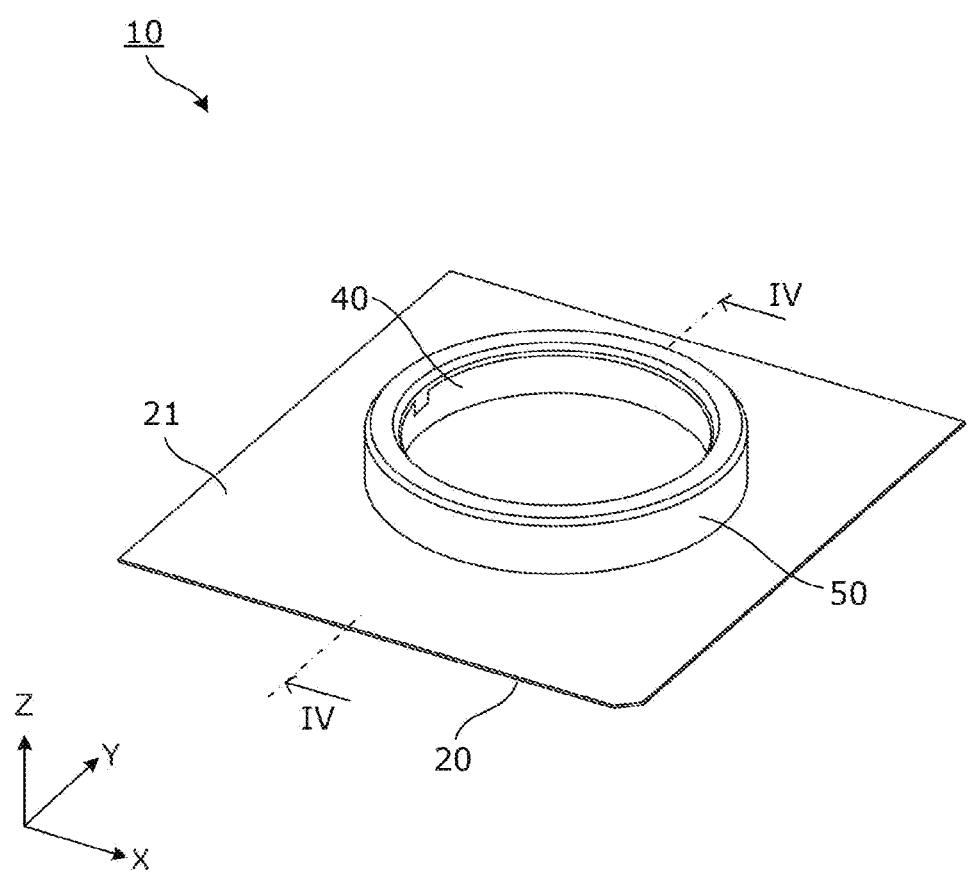
FIG. 1 is a perspective view illustrating a schematic configuration of an input device according to an embodiment.

An input device according to an aspect of the present disclosure includes: a first electrode; a support body that supports the first electrode; a fixed body fixed above the support body; a second electrode; a movable body that holds the second electrode in a state in which the second electrode faces the first electrode with a predetermined space being provided therebetween, the movable body causing the second electrode to approach and recede from the first electrode by moving by rotation or translation; an operation body held by the fixed body movably relative to the fixed body in a state in which the operation body is engaged with the movable body, the operation body causing, by being operated by a user, the movable body to move by rotation or translation; and a biasing part that is disposed between the movable body and the fixed body, and applies, to the movable body, a biasing force toward the support body.

According to this, the biasing part applies, to the movable body, a biasing force toward the support body, and thus the second electrode held by the movable body can be pressed against the first electrode supported by the support body. Accordingly, even while the movable body is moving, the second electrode is pressed against the first electrode, and the space therebetween is maintained constant. In consequence of this, a change in an electrical state between the first electrode and the second electrode can be reliably detected. Thus, sensitivity to a change in an electrical state in the input device can be maintained.

An operational force applied from the operation body while the movable body is moving and the biasing force applied from the biasing part are applied to the movable body at different positions.

According to this, an operational force applied from the operation body during movement and the biasing force applied from the biasing part are applied to the movable body at different positions, and thus the movable body can be smoothly moved. Since the movable body moves smoothly, friction between the first electrode and the second electrode can be reduced.

The movable body includes a protruding and recessed structure in which a plurality of recesses and a plurality of protrusions are continuously and alternately arranged in a movement direction in which the movable body moves, the plurality of recesses being recessed in a direction orthogonal to the movement direction, the plurality of protrusions protruding in the direction orthogonal to the movement direction, and the biasing part includes: an elastic body for applying the biasing force; a pressing body that is provided between the protruding and recessed structure and the elastic body, and elastically deforms the elastic body in conjunction with movement of the movable body; and a holding body that is fixed on the fixed body, and holds the elastic body and the pressing body, the holding body allowing the elastic body to deform and the pressing body to move.

Here, due to the movement of the movable body, a biasing force applied from the elastic body increases from when the pressing body passes on top of the recess of the protruding and recessed structure until when the pressing body passes on top of the protrusion thereof. On the other hand, a biasing force applied from the elastic body decreases from when the pressing body passes on top of the protrusion until when the pressing body passes on top of the recess. Thus, when the pressing body passes on top of the protrusion, an increase in the biasing force switches to a decrease, and thus this switch can be conveyed to a user as a click feeling.

The holding body includes a clearance portion in which the elastic body elastically deforms, the clearance portion having a recessed shape, and the clearance portion is provided in a portion across the elastic body from the pressing body.

According to this, the clearance portion that has a recessed shape and in which the elastic body elastically deforms is provided in the holding body, and thus the internal space of the clearance portion serves as a space into which the elastic body escapes. Accordingly, the elastic deformation of the elastic body can be facilitated, and even a thin elastic body can smoothly elastically deform and elastically restore the shape. Thus, the elastic body can be made thin.

A portion of the pressing body that comes into contact with the protruding and recessed structure has a curve that swells out toward the protruding and recessed structure.

According to this, a portion of the pressing body brought into contact with the protruding and recessed structure has a curved shape that swells out toward the protruding and recessed structure, and thus the pressing body can be rolled on the protruding and recessed structure.

The pressing body is a sphere.

According to this, since the pressing body is a sphere, the sphere can be smoothly moved on the protruding and recessed structure, and smooth operability can be achieved.

The movable body and the operation body rotate about a rotation center, and the biasing part applies the biasing force to the movable body from each of a pair of positions that overlap an outer circumferential portion of the movable body, the pair of positions having the rotation center of the movable body located therebetween.

According to this, the members in a pair of slits in the biasing part apply biasing forces to the movable body in the pair of positions provided with the rotation center of the movable body being located therebetween, which overlap the outer circumferential portion of the movable body, and thus biasing forces can be applied to the movable body in a balanced manner. Accordingly, the second electrode can be stably pressed against the first electrode.

The biasing part includes a click spring made of a metal plate.

According to this, even when the biasing part includes a click spring made of a metal plate, the second electrode held by the movable body can be pressed against the first electrode supported by the support body.

The first electrode includes a reference potential electrode, and two or more sets each including a transmission electrode and a reception electrode, the reference potential electrode faces at least a portion of the second electrode as a result of the second electrode approaching at least one set of a transmission electrode and a reception electrode out of the two or more sets, the two or more sets include: a first set of a transmission electrode and a reception electrode, the first set being disposed in a first region; and a second set of a transmission electrode and a reception electrode, the second set being disposed in a second region, and a phase when the first set approaches and recedes from the second electrode is different from a phase when the second set approaches and recedes from the second electrode.

According to this, the second electrode approaches and recedes from the two or more sets of the transmission electrodes and the reception electrodes in the movement direction by moving by rotation or translation in a state in which the second electrode faces the first electrode with a predetermined space being provided therebetween. Accordingly, when the second electrode moves by rotation or translation, an electrical state between the first electrode and the second electrode changes. An amount of relative movement between the first electrode and the second electrode can be detected by detecting such a change in an electrical state even if a third electrode is not provided. The first electrode and the second electrode face each other with a predetermined space being provided therebetween, even during relative movement, and thus no friction is caused therebetween. Accordingly, the first electrode and the second electrode can be prevented from being damaged, and the quality can be maintained over a long term.

Further, the first set of the transmission electrode and the reception electrode and the second set of the transmission electrode and the reception electrode have different phases when the first set and the second set approach and recede from the second electrode. Thus, a change in an electrical state caused by the first set and a change in an electrical state caused by the second set have different phases. The direction of the rotation can also be detected by detecting such a phase difference.

The reference potential electrode may not face a portion of the second electrode when the second electrode does not approach the at least one set.

The reference potential electrode may face a portion of the second electrode when the second electrode does not approach the at least one set.

An area of the portion of the second electrode that the reference potential electrode faces may increase when the second electrode approaches the at least one set.

Embodiment

Note that embodiments described below each show a particular example of the present disclosure. The numerical values, shapes, materials, elements, the arrangement and connection of the elements, steps, the order of processing the steps, and others indicated in the following embodiments are examples, and are not intended to limit the present disclosure. In addition, among the elements in the following embodiments, elements not recited in the independent claim showing an embodiment according to an aspect of the present disclosure are described as optional elements. The embodiments according to the present disclosure are not limited to the current independent claim, but can also be expressed by other independent claims.

[Structure of Input Device]

Figure 2:
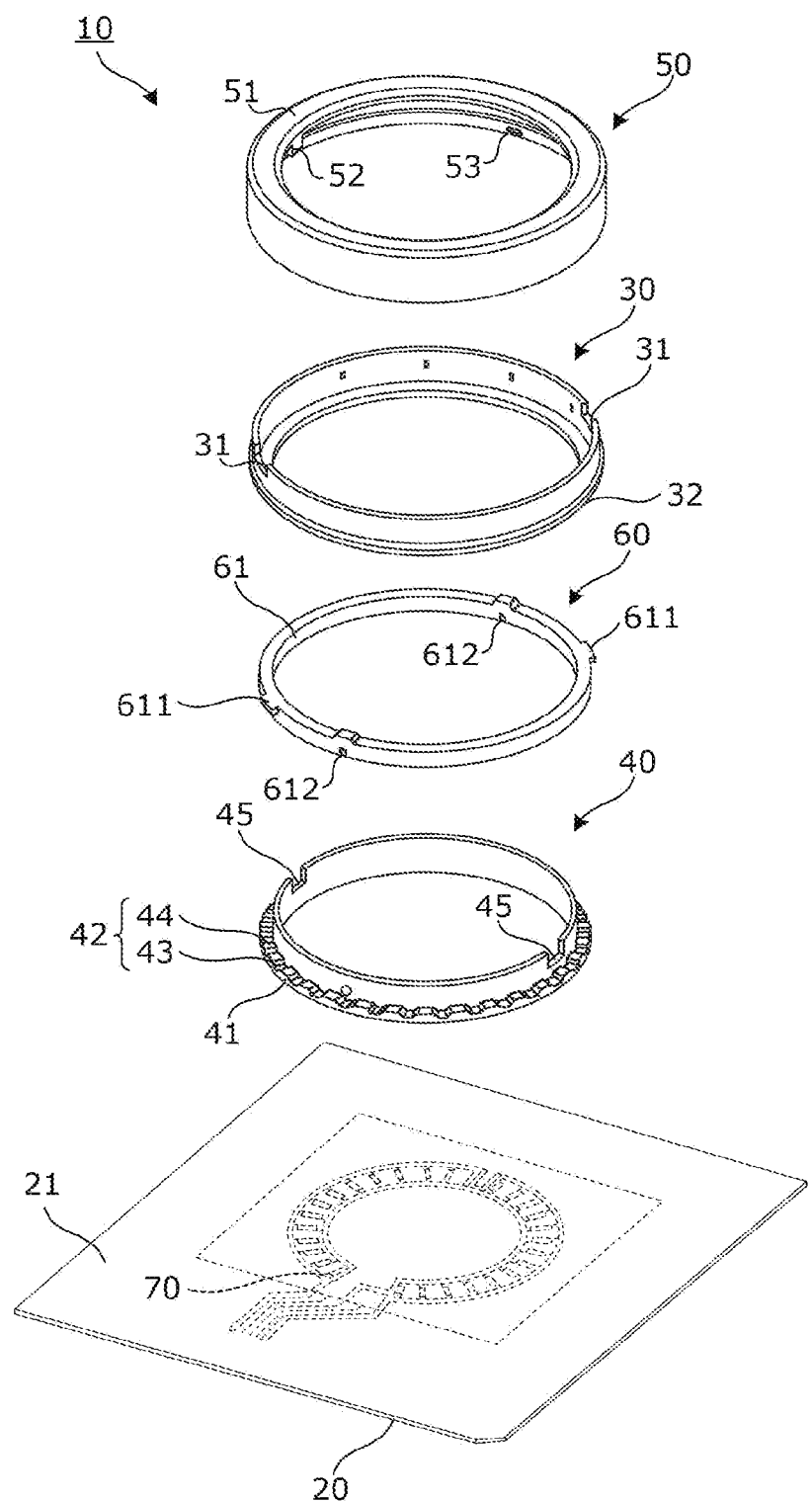
FIG. 2 is an exploded perspective view illustrating the input device according to the embodiment.
Figure 3:
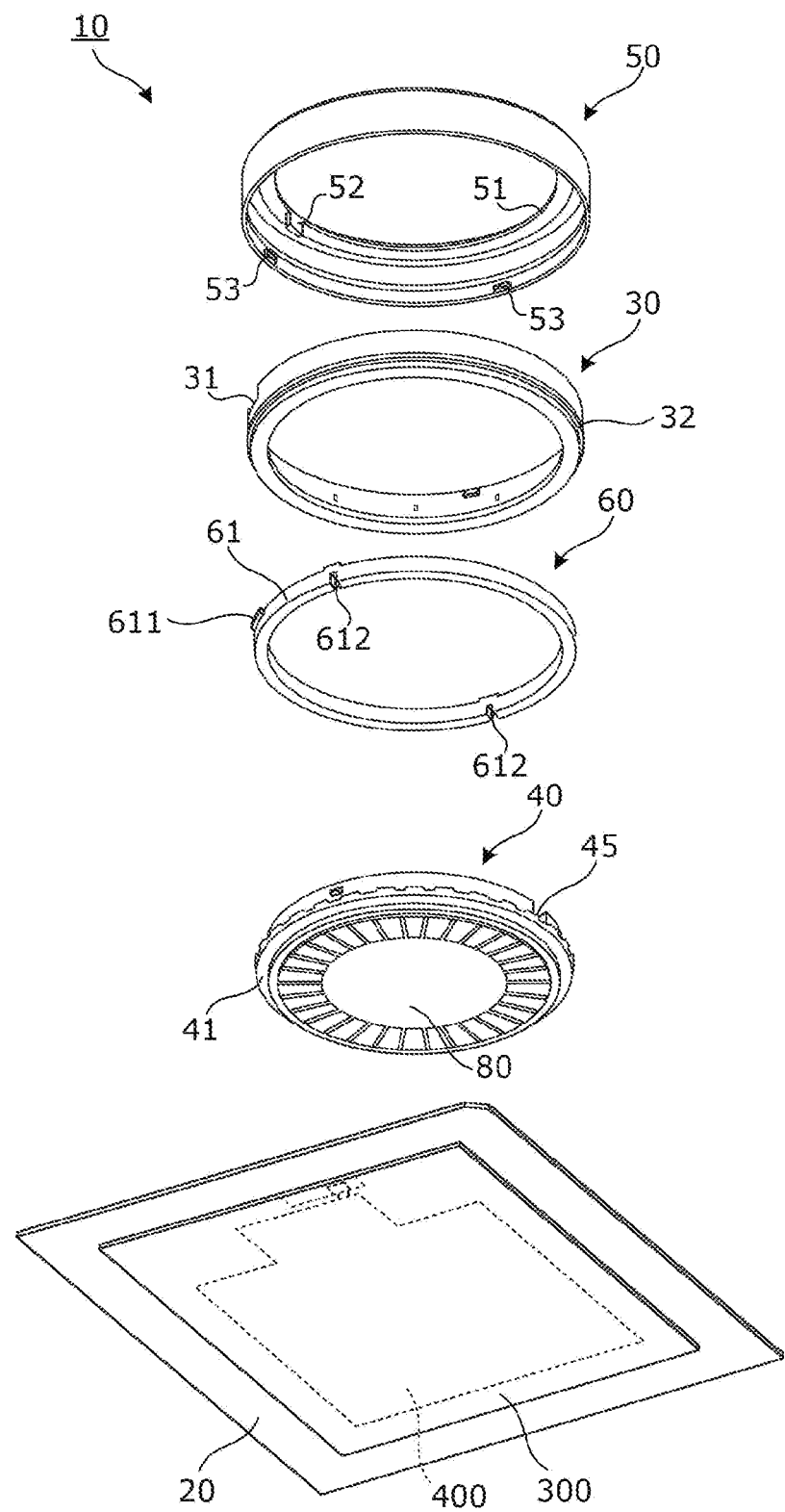
FIG. 3 is an exploded perspective view of the input device according to the embodiment, which is viewed from a different direction from that in FIG. 2.
Figure 4:
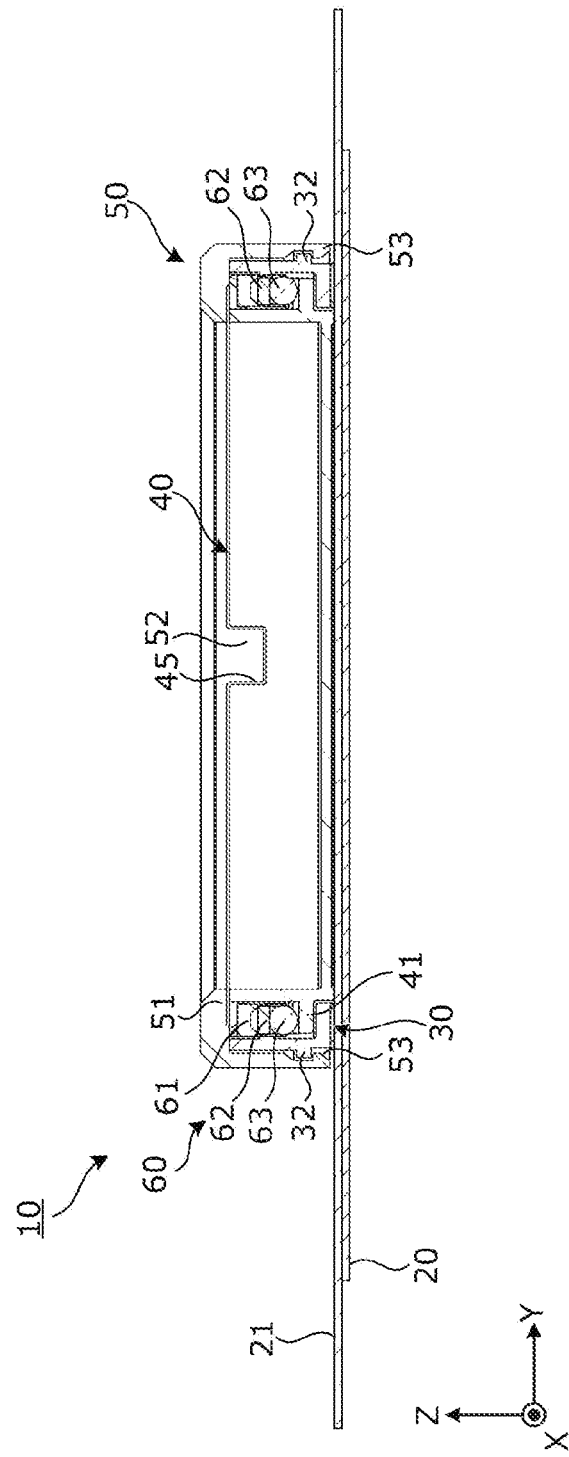
FIG. 4 is a cross sectional view of the input device according to the embodiment.

FIG. 1 is a perspective view illustrating a schematic configuration of input device 10 according to an embodiment. FIG. 2 is an exploded perspective view illustrating input device 10 according to the embodiment. FIG. 3 is an exploded perspective view of input device 10 according to the embodiment, which is viewed from a different direction from that in FIG. 2. FIG. 4 is a cross sectional view of input device 10 according to the embodiment. Specifically, FIG. 4 is a cross sectional view showing a cross section that includes line IV-IV in FIG. 1. The following explanation is on the assumption that the operation body 50 side is higher and the touch sensor 200 side is lower, for a convenience of the explanation, yet this positional relation is a mere example. The stated positional relation may not be achieved depending on how input device 10 is disposed (the orientation thereof).

As illustrated in FIG. 1 to FIG. 4, input device 10 is disposed on touch sensor 200, and detects an amount of rotational movement made in response to a rotational operation performed by a user. Specifically, input device 10 includes support body 20, fixed body 30, movable body 40, operation body 50, biasing part 60, first electrode 70, and second electrode 80.

Support body 20 is a substrate made of a light-transmitting resin. In the present embodiment, support body 20 serves also as a substrate of touch sensor 200. Accordingly, out of a pair of principal surfaces of support body 20, an electrode pattern for multipoint detection (not illustrated) and first electrode 70 for input device 10 are formed on and supported by at least one of the principal surfaces. The electrode pattern and first electrode 70 are transparent electrodes made of ITO (indium tin oxide), for example. As described above, first electrode 70 is an electrode of touch sensor 200. One of the principal surfaces of support body 20 is covered with cover lens 21 made of a light-transmitting member such as glass, for example. Second electrode 80 is disposed in a position opposed to first electrode 70 with cover lens 21 being provided therebetween. A light-transmitting adhesive layer (not illustrated) is provided between each pair of adjacent layers, and members are bonded by the adhesive layers.

Here, display panel 300 serving as an image display that displays images is disposed on the back side of touch sensor 200. Display panel 300 is a liquid crystal panel or an organic electroluminescent (EL) panel, for instance. Electrical shielding layer 400 is disposed between display panel 300 and touch sensor 200. Thus, it can be said that shielding layer 400 is disposed across first electrode 70 from second electrode 80. Shielding layer 400 can block electrical noise from display panel 300 disposed on the back side of input device 10. Accordingly, shielding layer 400 may be disposed in a region that overlaps at least the entirety of first electrode 70. However, shielding layer 400 can exhibit better effects of reducing noise if shielding layer 400 is disposed, covering a region larger than first electrode 70. Shielding layer 400 is a transparent electrode made of ITO, for example.

Fixed body 30 is a member that is fixed on one of the principal surfaces of support body 20. Fixed body 30 is formed into a cylinder, using a light-transmitting resin, for example. A pair of notches 31 are formed in an upper edge portion of fixed body 30 in positions opposed to each other. Circular protrusion 32 that continuously extends along the entire circumference is formed on the lower portion of the outer circumferential surface of fixed body 30.

Movable body 40 is a member that rotates relative to fixed body 30. Movable body 40 is formed into a cylinder having a closed bottom, using a light-transmitting resin, for example. Movable body 40 is disposed concentrically with fixed body 30. Thus, the rotation center of movable body 40 and the center of fixed body 30 are coaxially disposed.

A pair of notches 45 are formed in an upper edge portion of movable body 40 in positions opposed to each other with the rotation center being located therebetween. Brim portion 41 protruding outward from the entire circumference is provided along the outer circumference of movable body 40 on the bottom side. Protruding and recessed structure 42 is formed on the upper surface of brim portion 41. Protruding and recessed structure 42 includes alternate and continuous arrangement of recesses 43 that are recessed in a direction orthogonal to the movement direction (the rotation direction) of movable body 40 and protrusions 44 that are protruding in the orthogonal direction. Specifically, recesses 43 are recessed in a downwardly convex shape, and protrusions 44 are protruding in an upward concave shape. The upper surface of protruding and recessed structure 42, that is, the upper surface of brim portion 41 has a smoothly wavy shape.

Second electrode 80 is attached onto the undersurface of movable body 40. Second electrode 80 is a transparent electrode made of ITO, for example. Cover lens 21 is located between second electrode 80 and first electrode 70, and second electrode 80 and first electrode 70 face each other with a predetermined space being provided therebetween. Thus, movable body 40 holds second electrode 80 in a state in which second electrode 80 faces first electrode 70 with the predetermined space being provided therebetween.

Movable body 40 rotates in conjunction with operation body 50 being operated by a user, but maintains the state in which second electrode 80 and first electrode 70 face each other with the predetermined space being provided therebetween even during this rotation. The rotation of movable body 40 causes a portion of second electrode 80 to repeat approaching and receding from first electrode 70 in the movement direction.

Operation body 50 is a member held movably relative to fixed body 30 in a state in which operation body 50 is engaged with movable body 40. Operation body 50 is a member that rotates movable body 40 by being operated by a user. Specifically, operation body 50 is formed into a cylinder, using a light-transmitting resin, for example. Operation body 50 is disposed concentrically with movable body 40. Thus, the rotation center of operation body 50, the rotation center of movable body 40, and the rotation center of movable body 40 are coaxially disposed. Annular top plate portion 51 extending inward from the entire circumference is formed at the upper edge portion of operation body 50.

Figure 5:
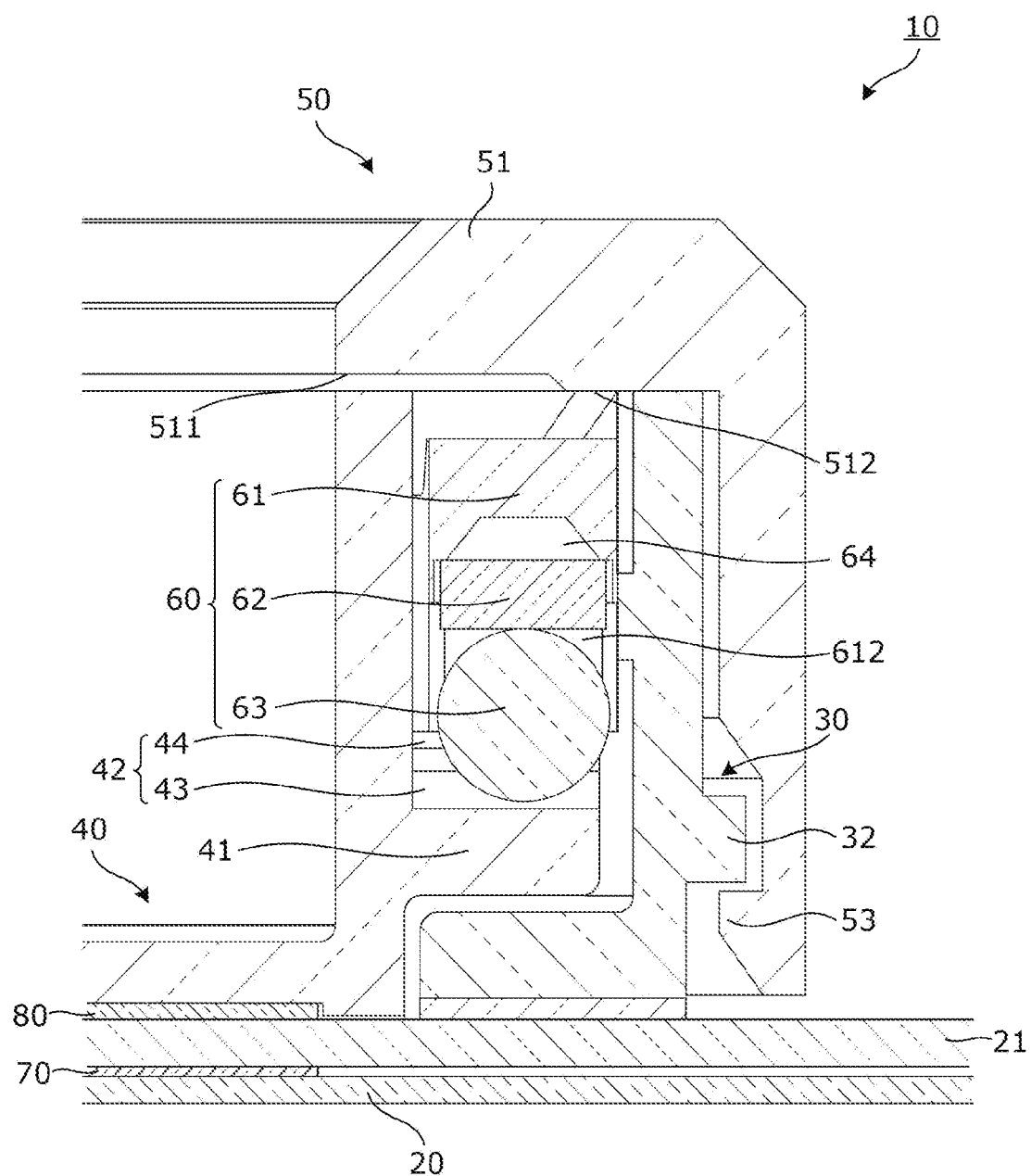
FIG. 5 is an enlarged cross sectional view of a portion of the input device according to the embodiment.

FIG. 5 is an enlarged cross sectional view of a portion of input device 10 according to the embodiment. As illustrated in FIG. 5, top plate portion 51 is a cover that closes the space between fixed body 30 and movable body 40. The inner circumferential surface of top plate portion 51 is disposed, being flush with the inner circumferential surface of movable body 40. The undersurface of top plate portion 51 has a step shape such that inner circumferential portion 511 is at a higher position than outer circumferential portion 512. Outer circumferential portion 512 of top plate portion 51 is in contact with the upper surface of fixed body 30, and thus downward movement of operation body 50 is restricted. On the other hand, inner circumferential portion 511 of top plate portion 51 is spaced apart from the upper surface of movable body 40. Accordingly, a force in the axial direction is prevented from being exerted from operation body 50 onto movable body 40.

Claw portions 53 that engage with circular protrusion 32 of fixed body 30 are provided at predetermined intervals in the circumferential direction, on the inner circumferential surface of top plate portion 51. Claw portions 53 are portions protruding inward from the inner circumferential surface of top plate portion 51. Claw portions 53 are provided below circular protrusion 32 of fixed body 30, so as to overlap circular protrusion 32 when viewed in the axial direction. Even if operation body 50 is raised and is to come apart from fixed body 30, claw portions 53 are brought into contact with circular protrusion 32 and locked. Thus, this achieves a structure in which operation body 50 does not come apart from fixed body 30. In addition, claw portions 53 and circular protrusion 32 do not mutually restrict circumferential movement, and thus operation body 50 is held movably relative to fixed body 30. The lower surface of each claw portion 53 is a tilt surface that tilts outward as the surface is lower, and thus when operation body 50 is attached to fixed body 30, the tilt surface is guided by circular protrusion 32 so that operation body 50 can be smoothly elastically deformed. After claw portion 53 moves over circular protrusion 32, the shape of operation body 50 returns back to the original shape.

As illustrated in FIG. 4, a pair of protruding portions 52 protruding downward are provided on the undersurface of top plate portion 51 in positions opposed to each other. Protruding portions 52 fit in notches 45 of movable body 40. Accordingly, rotational movement of operation body 50 is conveyed to movable body 40 via protruding portions 52 and notches 45, and causes movable body 40 to rotate. Notches 45 of movable body 40 are portions where operation body 50 applies an operational force when operation body 50 is moved.

As illustrated in FIG. 2 to FIG. 5, biasing part 60 is a portion that is disposed between movable body 40 and fixed body 30 and applies, to movable body 40, a biasing force towards support body 20. Biasing part 60 is disposed in a location different from those of notches 45. Accordingly, an operational force applied from operation body 50 and a biasing force applied from biasing part 60 are independently applied to movable body 40 in different positions.

Specifically, biasing part 60 includes holding body 61, elastic body 62, and sphere 63.

Holding body 61 is a member that is fixed relative to fixed body 30, and holds elastic body 62 and sphere 63, allowing elastic body 62 to deform and sphere 63 to move. Specifically, holding body 61 is a member formed into a cylinder, using a light-transmitting resin, for example. Holding body 61 is disposed concentrically with movable body 40. Thus, the center of holding body 61 and the rotation center of movable body 40 are coaxially disposed.

A pair of projections 611 that fit in notches 31 of fixed body 30 are formed at an upper edge portion of holding body 61 in positions opposed to each other with the rotation center being located therebetween. The pair of projections 611 project outward from the outer circumferential surface of holding body 61. The pair of projections 611 fit in notches 31 of fixed body 30, and thus holding body 61 is fixed relative to fixed body 30.

A pair of slits 612 that are open on the lower side are formed in the undersurface of holding body 61. The pair of slits 612 are provided in positions different from the positions of the pair of projections 611 and opposed to each other with the rotation center being located therebetween. Elastic body 62 and sphere 63 are stored in each of slits 612. Stated differently, a pair of elastic bodies 62 and a pair of spheres 63 are provided. Slits 612 are provided in positions that overlap brim portion 41 of movable body 40. Thus, slits 612 overlap the outer circumferential portion of movable body 40, and thus elastic bodies 62 and spheres 63 stored in slits 612 also overlap the outer circumferential portion of movable body 40.

As illustrated in FIG. 5, an upper portion of slit 612 is formed into a truncated cone that tapers as the slit approaches the top. Elastic body 62 is provided below the truncated cone portion. The portion of slit 612 above elastic body 62 is clearance portion 64 in which elastic body 62 elastically deforms when elastic body 62 is pressed upward. Clearance portion 64 is formed into a truncated cone as stated above, but is, in other words, formed into a recessed shape that is recessed upward. The internal space of clearance portion 64 serves as a space into which elastic body 62 escapes. Such a space facilitates elastic deformation of elastic body 62, and elastic body 62 can smoothly elastically deform or elastically restores the shape. In addition, since clearance portion 64 has a tapered shape, clearance portion 64 allows elastic deformation of elastic body 62 and furthermore can ensure that a portion around clearance portion 64 is sufficiently thick. Accordingly, this prevents holding body 61 from being readily damaged due to slits 612 being provided.

Elastic body 62 is a plate body formed of a light-transmitting resin, for example. Elastic body 62 is a member that is less rigid than other members (support body 20, fixed body 30, movable body 40, operation body 50, holding body 61, and sphere 63). Specifically, elastic body 62 is formed of a light-transmitting silicon resin. Note that elastic body 62 may be formed of an elastic light-transmitting material or may be formed using a light-transmitting material into a shape that exhibits elasticity. In each slit 612, sphere 63 is rotatably provided below elastic body 62.

Sphere 63 is an example of a pressing body that elastically deforms elastic body 62 in conjunction with the movement of movable body 40. Sphere 63 is formed of a light-transmitting resin, for example. Sphere 63 is placed above the upper surface of protruding and recessed structure 42 of movable body 40. In this manner, sphere 63, elastic body 62, and holding body 61 are arranged in this order above protruding and recessed structure 42. Since the members are arranged in the above order, a biasing force toward support body 20 caused by elastic body 62 can be given to movable body 40 via sphere 63 and protruding and recessed structure 42.

Specifically, when movable body 40 rotates relative to fixed body 30 and holding body 61, recesses 43 and protrusions 44 of protruding and recessed structure 42 alternately pass immediately under sphere 63. Accordingly, sphere 63 moves up and down.

For example, in a state in which recess 43 is immediately under sphere 63, sphere 63 is at a lower position and thus does not push elastic body 62 up, as illustrated in FIG. 5. Elastic body 62 maintains its original shape. On the other hand, when recess 43 moves away from the position immediately under sphere 63, sphere 63 gradually moves upward along with the wavy shape of the upper surface of protruding and recessed structure 42. Since sphere 63 pushes elastic body 62 up along with the upward movement, elastic body 62 elastically deforms. When elastic body 62 elastically deforms, elastic body 62 is to elastically restore the shape, and thus the restoring force (biasing force) is applied to sphere 63. Accordingly, sphere 63 pushes down protruding and recessed structure 42. Thus, movable body 40 is given, from biasing part 60, a biasing force toward support body 20.

The portions indicated by the two-dot chain lines in FIG. 5 show sphere 63 and elastic body 62 when sphere 63 is placed at the top of protrusion 44. This state is a state in which elastic body 62 elastically deforms most and in which movable body 40 receives the greatest biasing force from biasing part 60. Due to the rotation of movable body 40, a biasing force increases from when the top of recess 43 passes under sphere 63 until when the top of protrusion 44 passes under sphere 63. On the other hand, a biasing force decreases from when the top of protrusion 44 passes under sphere 63 until when the top of recess 43 passes under sphere 63. Thus, when the top of protrusion 44 passes under sphere 63, an increase in the biasing force switches to a decrease, and thus this switch is conveyed to a user via operation body 50 as a click feeling.

Here, a biasing force that biasing part 60 applies to movable body 40 is caused by elastic body 62 and sphere 63 in each slit 612. Thus, biasing part 60 applies a biasing force to movable body 40 from each of the paired positions provided with the rotation center of movable body 40 being located therebetween, which overlap the outer circumferential portion of movable body 40. Accordingly, biasing forces can be applied to movable body 40 in a balanced manner.

Note that sphere 63 may push elastic body 62 up also in a state in which recess 43 is directly under sphere 63. In this case, sphere 63 always receives a biasing force from elastic body 62. Stated differently, movable body 40 is always given from biasing part 60 a biasing force toward support body 20.

[First Electrode and Second Electrode]

Figure 6:
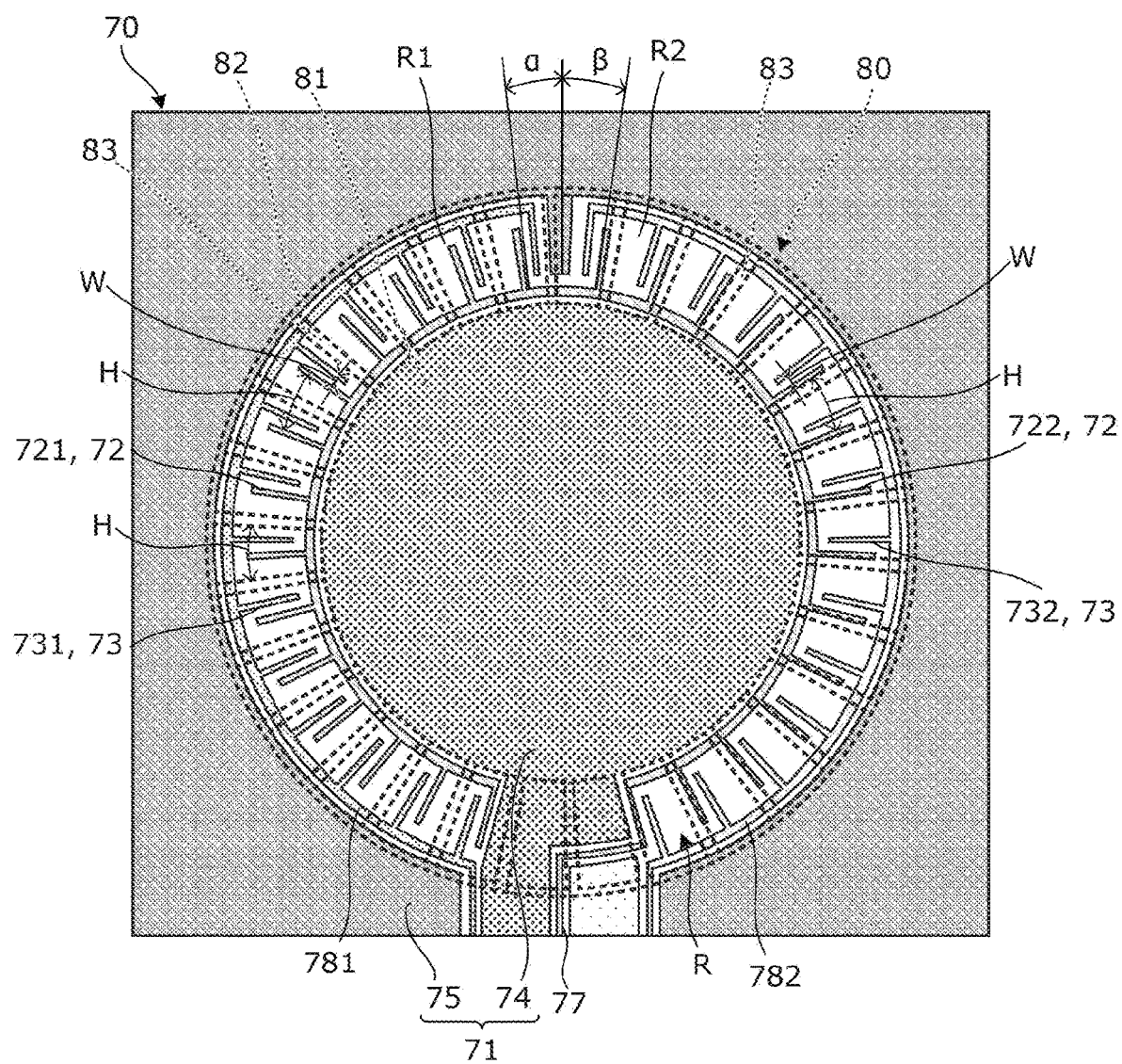
FIG. 6 is a plan view illustrating a first electrode and a second electrode according to the embodiment.

Next, first electrode 70 and second electrode 80 are to be described in detail. FIG. 6 is a plan view illustrating first electrode 70 and second electrode 80 according to the embodiment. In FIG. 6, first electrode 70 is hatched with dots, and the outer shape of second electrode 80 is indicated by the broken lines. As described above, first electrode 70 is disposed on a principal surface of support body 20, whereas second electrode 80 is disposed on the undersurface of movable body 40. First electrode 70 and second electrode 80 face each other with a predetermined space being provided therebetween since cover lens 21 is disposed therebetween.

As illustrated in FIG. 6, first electrode 70 includes ground electrode 71, and at least two sets each including transmission electrode 72 and reception electrode 73.

Ground electrode 71 is an example of a reference potential electrode, and includes first ground electrode 74 (a first reference potential electrode) and second ground electrode 75 (a second reference potential electrode). Note that the reference potential electrode may be an electrode having a reference potential at a potential other than the ground potential. First ground electrode 74 is formed into a substantially circular shape. Second ground electrode 75 is formed, surrounding first ground electrode 74 with a predetermined space being provided therebetween. Region R between first ground electrode 74 and second ground electrode 75 is formed into a substantially ring shape. Region R is partitioned into first region R1 and second region R2. First region R1 is a substantially half region on the left side of region R, whereas second region R2 is a substantially half region on the right side of region R. Thus, first region R1 and second region R2 have substantially the same area. Portions of ground electrode 71 are disposed in boundary portions between first region R1 and second region R2. Specifically, a portion of second ground electrode 75 is disposed in an upper boundary portion in FIG. 6. A portion of first ground electrode 74 is disposed in a lower boundary portion in FIG. 6.

A plurality of sets each including transmission electrode 72 and reception electrode 73 are disposed in region R. Specifically, transmission conductive pattern 77 that includes transmission electrodes 72 in the plurality of sets is disposed along the outer circumference of first ground electrode 74 in region R. Transmission conductive pattern 77 includes transmission electrodes 72 extending radially and disposed at positions in the circumferential direction. Transmission electrodes 72 are each formed into a stick shape extending outward. In the following, out of transmission electrodes 72, transmission electrodes 72 disposed in first region R1 may each be referred to as first transmission electrode 721, and transmission electrodes 72 disposed in second region R2 may each be referred to as second transmission electrode 722.

First transmission electrodes 721 are disposed at constant intervals H in the circumferential direction. Similarly, second transmission electrodes 722 are disposed at constant intervals H in the circumferential direction, yet second transmission electrodes 722 and first transmission electrodes 721 have different topologies. For example, first transmission electrodes 721 are disposed at regular intervals in the circumferential direction, when a position shifted leftward from a reference that is the upper boundary portion by angle α is a starting point. On the other hand, second transmission electrodes 722 are disposed at regular intervals in the circumferential direction, when a position shifted rightward from a reference that is the upper boundary portion by angle β greater than angle α is a starting point.

A pair of reception conductive patterns 781 and 782 that include reception electrodes 73 in the plurality of sets are disposed along the inner circumference of second ground electrode 75 in region R. Out of the pair of reception conductive patterns 781 and 782, reception conductive pattern 781 that is one of the pair is disposed in first region R1, and reception conductive pattern 782 that is the other of the pair is disposed in second region R2. Reception conductive pattern 781 that is the one of the pair and reception conductive pattern 782 that is the other of the pair include reception electrodes 73 extending radially and disposed at positions in the circumferential direction. Reception electrodes 73 are each formed into a stick shape extending inward.

In the following, out of reception electrodes 73, reception electrodes 73 disposed in first region R1 may each be referred to as first reception electrode 731, and reception electrodes 73 disposed in second region R2 may each be referred to as second reception electrode 732. In the present embodiment, 14 sets each including first transmission electrode 721 and first reception electrode 731 are disposed in first region R1, and 14 sets each including second transmission electrode 722 and second reception electrode 732 are disposed in second region R2.

Each of first reception electrodes 731 faces first transmission electrode 721 that is paired therewith at regular interval W in the circumferential direction. Each of second reception electrodes 732 faces second transmission electrode 722 that is paired therewith at regular interval W in the circumferential direction. As described above, first transmission electrodes 721 and second transmission electrodes 722 have different topologies, and thus first reception electrodes 731 and second reception electrodes 732 also have different topologies. Note that the present embodiment has shown an example in which transmission electrodes 72 are disposed on the inner side, whereas reception electrodes 73 are disposed on the outer side, yet the positional relation between the transmission electrodes and the reception electrodes may be reversed.

Second electrode 80 includes circular portion 81, outer ring portion 82, and a plurality of connected portions 83. Circular portion 81 is a round portion, and substantially entirely overlaps first ground electrode 74 in a plan view. Outer ring portion 82 is a portion concentric with circular portion 81, which surrounds the entire circumference of circular portion 81 with a predetermined space being provided therebetween. Outer ring portion 82 substantially entirely overlaps second ground electrode 75 in a plan view. 32 connected portions 83 are provided in the present embodiment. Connected portions 83 are disposed between circular portion 81 and outer ring portion 82, and arranged at regular intervals in the circumferential direction. Specifically, connected portions 83 are arranged at intervals H in the circumferential direction. Connected portions 83 each have a stick shape extending in the radial direction, and are connected to circular portion 81 and outer ring portion 82.

Second electrode 80 rotates along with the rotation of movable body 40. At this time, second electrode 80 rotates while maintaining the predetermined space from first electrode 70. During the rotation, connected portions 83 repeat approaching and receding from transmission electrodes 72 and reception electrodes in the circumferential direction. At this time, connected portions 83 disposed in first region R1 have a uniform positional relation with each set of first transmission electrode 721 and first reception electrode 731. Connected portions 83 disposed in second region R2 have a uniform positional relation with each set of second transmission electrode 722 and second reception electrode 732. However, as described above, the sets each including first transmission electrode 721 and first reception electrode 731 and the sets each including second transmission electrode 722 and second reception electrode 732 have different topologies. Accordingly, the phase when connected portions 83 approach those sets and the phase when connected portions 83 recede from those sets are also different from each other.

Figure 7:
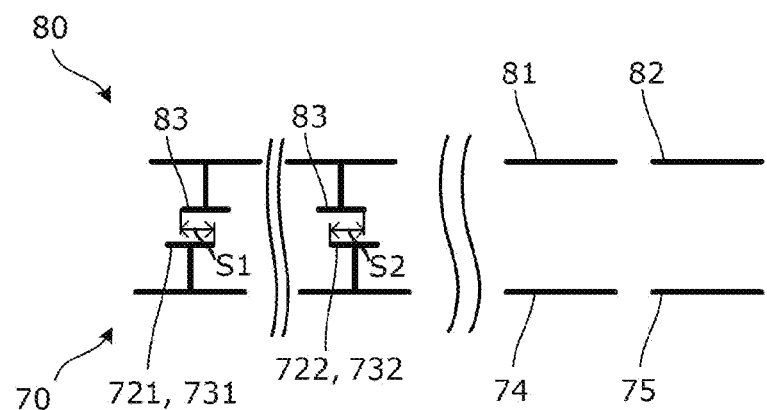
FIG. 7 illustrates schematic diagrams each showing a positional relation between the first electrode and the second electrode according to the embodiment when viewed sideward.
Figure 7:
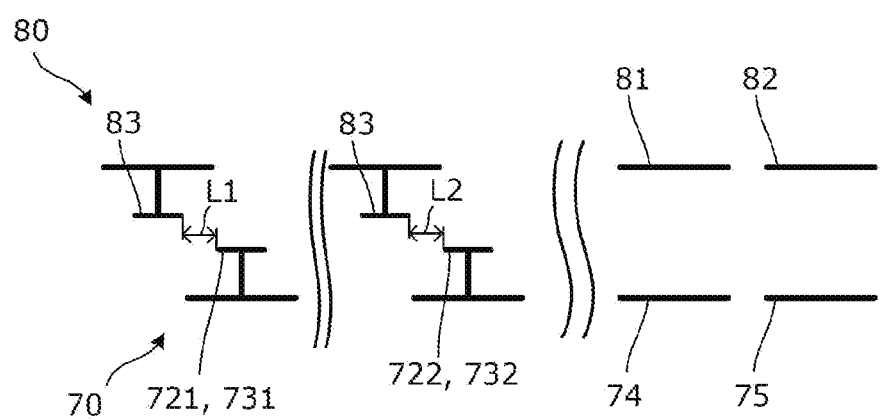

FIG. 7 illustrates schematic diagrams each showing a positional relation between first electrode 70 and second electrode 80 according to the embodiment when viewed sideward. FIG. 7 collectively illustrates first transmission electrode 721 and first reception electrode 731 that are included in one set of first electrode 70, and collectively illustrates second transmission electrode 722 and second reception electrode 732 that are included in one set thereof.

Part (a) of FIG. 7 illustrates a first state. The first state refers to a state in which the area in which first transmission electrode 721 and first reception electrode 731 overlap connected portion 83 of second electrode 80 (overlapping area S1) and the area in which second transmission electrode 722 and second reception electrode 732 overlap connected portion 83 (overlapping area S2) are equal to each other. Here, transmission electrode 72 and reception electrode 73 in each set are spaced apart from each other in the circumferential direction, yet a region therebetween is assumed to be part of transmission electrode 72 and reception electrode 73. Accordingly, such a region is assumed to be included in overlapping areas S1 and S2 if the region overlaps connected portion 83. Stated differently, it is sufficient if "equal" is substantially equal. The same applies to the term "same".

Part (b) of FIG. 7 illustrates a second state. The second state is a state in which distance L1 over which first transmission electrode 721 and first reception electrode 731 are spaced apart from connected portion 83 and distance L2 over which second transmission electrode 722 and second reception electrode 732 are spaced apart from connected portion 83 are equal to each other. Note that the term "equal" means not only completely matching, but also includes a state in which approximately several percent of a slight error is included.

Second electrode 80 rotates relative to first electrode 70. Accordingly, transition from the first state to the second state and transition from the second state to the first state repeatedly occur. Further, during rotation, circular portion 81 of second electrode 80 always faces first ground electrode 74, and outer ring portion 82 of second electrode 80 always faces second ground electrode 75. Accordingly, also during the rotation of second electrode 80, electrical coupling between circular portion 81 and first ground electrode 74 is increased, and electrical coupling between outer ring portion 82 and second ground electrode 75 is increased.

Here, capacitance between (i) connected portion 83 and (ii) transmission electrode 72 and reception electrode 73 is small when the overlapping area is the largest. In contrast, the capacitance is great when the distance over which transmission electrode 72 and reception electrode 73 are spaced apart from connected portion 83 is the longest. Reception electrodes 73 each output a change in capacitance at that point as an electrical signal.

[Control Configuration]

Figure 8:
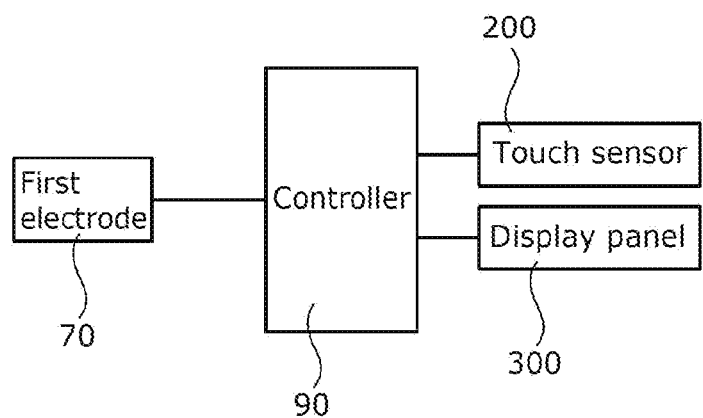
FIG. 8 is a block diagram illustrating a control configuration of the input device according to the embodiment.

Next, a control configuration of input device 10 is to be described. FIG. 8 is a block diagram illustrating a control configuration of input device 10 according to the embodiment. As illustrated in FIG. 8, input device 10 includes first electrode 70, and controller 90 electrically connected to touch sensor 200 and display panel 300. Controller 90 includes a central processing unit (CPU), random access memory (RAM), and read only memory (ROM), and is configured to execute various processes by the CPU loading and executing programs stored in the ROM. Controller 90 supplies power to transmission electrodes 72 of first electrode 70, and detects an amount of movement of second electrode 80 relative to first electrode 70, based on electrical signals received from reception electrode 73. Detecting an amount of movement is to be described later. Controller 90 also receives an input signal from touch sensor 200, and controls display content of display panel 300, based on the input signal and the detected amount of movement.

For example, controller 90 controls a color to light emission of a pixel group of display panel 300 that overlap support body 20. Accordingly, display panel 300 emits light toward support body 20. As described above, the members of input device 10 (support body 20, fixed body 30, movable body 40, operation body 50, biasing part 60, first electrode 70, and second electrode 80) have light-transmitting properties, and thus the light emitted from display panel 300 travels through the members. Thus, the light from display panel 300 can produce optical effects on the members.

[Detection of Amount of Movement]

Figure 9:
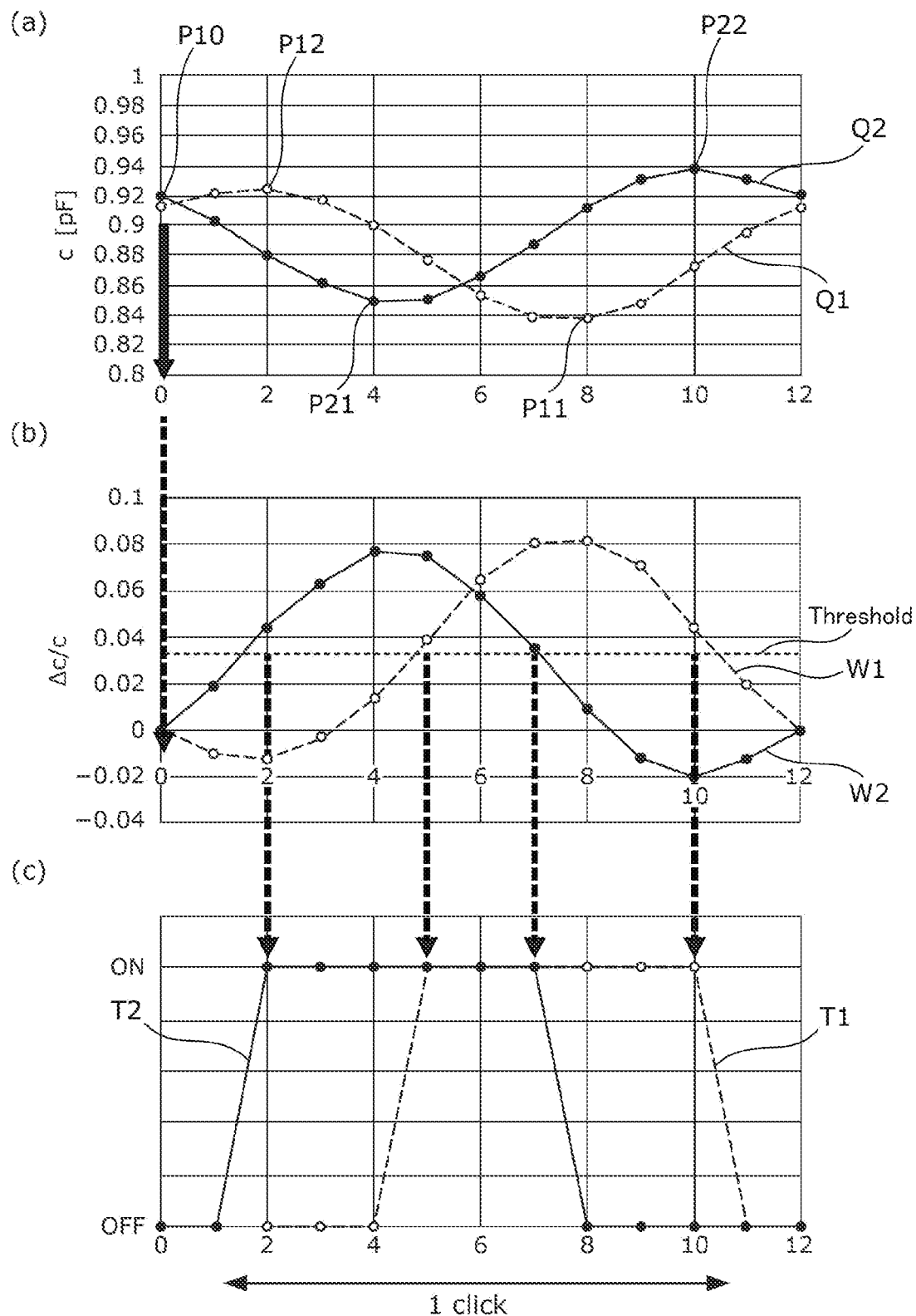
FIG. 9 illustrates explanatory drawings for describing detection of an amount of movement of the input device according to the embodiment.

Next, detection of an amount of movement is to be described. FIG. 9 illustrates explanatory drawings for describing detection of an amount of movement of input device 10 according to the embodiment. Part (a) of FIG. 9 illustrates changes in capacitance of first electrode 70 and second electrode 80 during rotation. Specifically, a change in capacitance caused by connected portion with first transmission electrode 721 and first reception electrode 731 is referred to as first capacitance change Q1, and a change in capacitance caused by connected portion 83 with second transmission electrode 722 and second reception electrode 732 is referred to as second capacitance change Q2. First capacitance change Q1 and second capacitance change Q2 have waveforms having phases different form each other. An overlapping area in which first transmission electrode 721 and first reception electrode 731 overlap connected portion 83 is the largest at point P11 of first capacitance change Q1, and the distance over which first transmission electrode 721 and first reception electrode 731 are spaced apart from connected portion 83 is the longest at point P12. Similarly, an overlapping area in which second transmission electrode 722 and second reception electrode 732 overlap connected portion 83 is the largest at point P21 of second capacitance change Q2, and the distance over which second transmission electrode 722 and second reception electrode 732 are spaced apart from connected portion 83 is the longest at point P22.

Here, point P10 is set to a mechanical operation origin of input device 10 in (a) of FIG. 9. Point P10 corresponds to the second state, and is in the vicinity of an intersection between first capacitance change Q1 and second capacitance change Q2. Note that at least one of first capacitance change Q1 or second capacitance change Q2 may be calibrated so that first capacitance change Q1 and second capacitance change Q2 intersect at point P10.

Part (b) of FIG. 9 illustrates a change in an electrical state during rotation. Here, an electrical state refers to an amount of change in each of first capacitance change Q1 and second capacitance change Q2. Such amounts of change are detected as electrical signals in controller 90. In (b) of FIG. 9, the waveform of a capacitance change rate (Δc/c) of first capacitance change Q1 is first waveform W1, and the waveform of a capacitance change rate of second capacitance change Q2 is second waveform W2. Controller 90 distinguishes, for each of first waveform W1 and second waveform W2, a portion having a value greater than or equal to a predetermined threshold as an ON signal from a portion having a value less than the predetermined threshold as an OFF signal. The distinguishing result is shown in (c) of FIG. 9. Part (c) of FIG. 9 illustrates distinguishing result T1 of first waveform W1 and distinguishing result T2 of second waveform W2.

At operation origin (point P10), first waveform W1 and second waveform W2 are both on the negative side relative to the predetermined threshold, and thus distinguishing results T1 and T2 both show an OFF signal at the operation origin. Note that should point P12 be an operation origin, an ON signal and an OFF signal both occur at the operation origin, which is not preferable.

Controller 90 considers, for each of first waveform W1 and second waveform W2, a portion that is an ON signal to be an amount of movement per unit. In the present embodiment, the amount of movement per unit is an amount of movement for one click.

Controller 90 determines the case where first waveform W1 indicates output of an ON signal and thereafter second waveform W2 indicates output of an ON signal is "normal rotation", and the case where second waveform W2 indicates output of an ON signal and thereafter first waveform W1 indicates output of an ON signal is "reverse rotation".

Note that in the present embodiment, the case where a portion corresponding to the second state is assumed to be an operation origin is shown as an example, yet a portion corresponding to the first state may be an operation origin. In this case, controller 90 may reverse the positive and negative values of the first waveform and the second waveform, and distinguish between an ON signal and an OFF signal.

Advantageous Effects and Others

As described above, input device 10 according to the present embodiment includes: first electrode 70; support body 20 that supports first electrode 70; fixed body 30 fixed above support body 20; second electrode 80; movable body 40 that holds second electrode 80 in a state in which second electrode 80 faces first electrode 70 with a predetermined space being provided therebetween, movable body 40 causing second electrode 80 to approach and recede from first electrode 70 in a movement direction by rotating; operation body 50 held movably relative to fixed body 30 in a state in which operation body 50 is engaged with movable body 40, operation body 50 causing, by being operated by a user, movable body 40 to rotate; and biasing part 60 that is disposed between movable body 40 and fixed body 30, and applies, to movable body 40, a biasing force toward support body 20.

According to this, biasing part 60 applies, to movable body 40, a biasing force toward support body 20, and thus second electrode 80 held by movable body 40 can be pressed against first electrode 70 supported by support body 20. Accordingly, even while movable body 40 is moving, second electrode 80 is pressed against first electrode 70, and the space therebetween is maintained constant. In consequence of this, a change in an electrical state between first electrode 70 and second electrode 80 can be reliably detected. Thus, sensitivity to a change in an electrical state in input device 10 can be maintained.

An operational force applied from operation body 50 while movable body 40 is moving and the biasing force applied from biasing part 60 are applied to movable body 40 independently.

According to this, an operational force applied from operation body 50 while movable body 40 is moving and a biasing force applied from biasing part 60 are independently applied to movable body 40, and thus the operational force and the biasing force can be exerted on different positions on movable body 40. Thus, movable body 40 can be moved smoothly. Since movable body 40 moves smoothly, friction between first electrode 70 and second electrode 80 can be reduced.

Movable body 40 includes protruding and recessed structure 42 in which a plurality of recesses 43 and a plurality of protrusions 44 are continuously and alternately arranged in a movement direction in which movable body 40 moves, the plurality of recesses 43 being recessed in a direction orthogonal to the movement direction, the plurality of protrusions 44 protruding in the direction orthogonal to the movement direction, and biasing part 60 includes: elastic body 62 for applying the biasing force; sphere 63 (pressing body) that is provided between protruding and recessed structure 42 and elastic body 62, and elastically deforms elastic body 62 in conjunction with movement of movable body 40; and holding body 61 that is fixed on fixed body 30, and holds elastic body 62 and sphere 63, holding body 30 allowing elastic body 62 to deform and sphere 63 to move.

Here, due to the movement of movable body 40, a biasing force applied from elastic body 62 increases from when sphere 63 passes on top of recess 43 of protruding and recessed structure 42 until when sphere 63 passes on top of protrusion 44 thereof. On the other hand, a biasing force applied from elastic body 62 decreases from when sphere 63 passes on top of protrusion 44 until when sphere 63 passes on top of recess 43. Thus, when sphere 63 passes on top of protrusion 44, an increase in the biasing force switches to a decrease, and thus this switch can be conveyed to a user as a click feeling.

Holding body 61 includes clearance portion 64 in which elastic body 62 elastically deforms, clearance portion 64 having a recessed shape, and clearance portion 64 is provided in a portion across elastic body 62 from sphere 63.

According to this, clearance portion 64 that has a recessed shape and in which elastic body 62 elastically deforms is provided in holding body 61, and thus the internal space of clearance portion 64 serves as a space into which elastic body 62 escapes. Accordingly, the elastic deformation of elastic body 62 can be facilitated, and even thin elastic body 62 can smoothly elastically deform and elastically restore the shape. Thus, elastic body 62 can be made thin.

Sphere 63 is a pressing body that elastically deforms elastic body 62 in conjunction with the movement of movable body 40. According to this, since a pressing body is sphere 63, sphere 63 can be smoothly moved on protruding and recessed structure 42, and smooth operability can be achieved.

Movable body 40 and operation body 50 rotate about a rotation center, and biasing part 60 applies the biasing force to movable body 40 from each of a pair of positions that overlap an outer circumferential portion of movable body 40, the pair of positions having the rotation center of movable body 40 located therebetween.

According to this, the members in pair of slits in biasing part 60 apply biasing forces to movable body 40 in a pair of positions provided with the rotation center of movable body 40 being located therebetween, which overlap the outer circumferential portion of movable body 40, and thus biasing forces can be applied to movable body 40 in a balanced manner. Accordingly, second electrode 80 can be stably pressed against first electrode 70.

Input device 10 according to the present embodiment includes: first electrode 70 that includes: ground electrode 71; and two or more sets of transmission electrodes 72 and reception electrodes 73, the two or more sets each including one of transmission electrodes 72 and one of reception electrodes 73; and second electrode 80 that approaches and recedes from the two or more sets in a movement direction by rotating in a state in which second electrode 80 faces first electrode 70 with a predetermined space being provided therebetween. Ground electrode 71 faces at least a portion of second electrode 80 as a result of second electrode 80 approaching at least one set of transmission electrode 72 and reception electrode 73 out of the two or more sets, the two or more sets include: a first set of transmission electrode 72 and reception electrode 73, the first set being disposed in first region R1; and a second set of transmission electrode 72 and reception electrode 73, the second set being disposed in second region R2. A phase when the first set of first transmission electrode 721 and first reception electrode 731 approaches and recedes from second electrode 80 is different from a phase when the second set of second transmission electrode 722 and second reception electrode 732 approaches and recedes from second electrode 80.

According to this, second electrode 80 approaches and recedes from the two or more sets of transmission electrodes 72 and reception electrodes 73 in the movement direction by rotating in a state in which second electrode 80 faces first electrode 70 with a predetermined space being provided therebetween. Accordingly, when second electrode 80 rotates, an electrical state between first electrode 70 and second electrode 80 changes. An amount of relative movement between first electrode 70 and second electrode 80 can be detected by detecting such a change in an electrical state even if a third electrode is not provided. First electrode 70 and second electrode 80 face each other with a predetermined space being provided therebetween, even during relative movement, and thus no friction is caused therebetween. Accordingly, first electrode 70 and second electrode 80 can be prevented from being damaged, and the quality can be maintained over a long term.

Further, a phase when the first set of first transmission electrode 721 and first reception electrode 731 disposed in first region R1 approaches and recedes from second electrode 80 and a phase when the second set of second transmission electrode 722 and second reception electrode 732 disposed in second region R2 approaches and recedes from second electrode 80 are different from each other. Thus, a change in an electrical state caused by the set disposed in first region R1 and a change in an electrical state caused by the set disposed in second region R2 have different phases. The direction of the rotation can also be detected by detecting such a phase difference.

One or more reference potential electrodes constitute ground electrode 71.

According to this, since the one or more reference potential electrodes constitute ground electrode 71, a power source does not need to be added, and thus a circuit configuration can be simplified.

Input device 10 at an operation origin is in a state (first state) in which overlapping area S1 in which the first set of first transmission electrode 721 and first reception electrode 731 overlaps second electrode 80 is substantially equal to overlapping area S2 in which the second set of second transmission electrode 722 and second reception electrode 732 overlaps second electrode 80.

Input device 10 at an operation origin is in a state (second state) in which distance L1 over which the first set of first transmission electrode 721 and first reception electrode 731 is apart from second electrode 80 is substantially equal to distance L2 over which the second set of second transmission electrode 722 and second reception electrode 732 is apart from second electrode 80.

According to this, input device 10 at the operation origin is in the first state or the second state, and thus the operation origin is in the vicinity of a cross point of a change in an electrical state caused by the set disposed in first region R1 and a change in an electrical state caused by the set disposed in second region R2. Accordingly, a change in an electrical state caused by the set disposed in first region R1 and a change in an electrical state caused by the set disposed in second region R2 both appear on the same side, that is, the positive or negative side relative to the predetermined threshold, and thus the distinguishing results thereof indicate either ON signals or OFF signals at the operation origin. Accordingly, the amount of relative movement between first electrode 70 and second electrode 80 can be more accurately detected. Thus, the quality of input device 10 can be increased without using a third electrode.

An area of first region R1 is substantially equal to an area of second region R2.

Accordingly, the change in an electrical state caused by the set disposed in first region R1 and the change in an electrical state caused by the set disposed in second region R2 can be made equal to each other, and a phase difference between the changes of the electrical states can be more reliably detected. Thus, the quality of input device 10 can be increased without using a third electrode.

Transmission electrodes 72 and reception electrodes 73 in the two or more sets are arranged in a ring, and one or more ground electrodes 71 include: first ground electrode 74 disposed inside of the ring; and second ground electrode 75 disposed outside of the ring.

According to this, one or more ground electrodes 71 include first ground electrode 74 and second ground electrode 75, and thus electrical coupling at the ground potential can be increased, and a change in an electrical state of first electrode 70 can be increased. If a change in an electrical state of first electrode 70 is increased, the detection accuracy can be increased.

First electrode 70 and second electrode 80 are transparent electrodes.

According to this, first electrode 70 and second electrode 80 are transparent electrodes, and thus information present on the back side of input device 10 can pass through first electrode 70 and second electrode 80. Thus, input device 10 having good design can be achieved.

First electrode 70 is an electrode of touch sensor 200.

According to this, the electrode of touch sensor 200 can be used as first electrode 70, and thus if input device 10 is disposed on touch sensor 200, the electrode of touch sensor 200 can serve also as first electrode 70 of input device 10. Thus, the number of components can be reduced.

Input device 10 further includes: electrical shielding layer 400 disposed across first electrode 70 from second electrode 80.

According to this, electrical shielding layer 400 is disposed across first electrode 70 from second electrode 80, and thus shielding layer 400 can block noise from electrical devices disposed on the back side of input device 10. Thus, the amount of relative movement between first electrode 70 and second electrode 80 can be more accurately detected.

Further, input device 10 includes: display panel 300 (image display); support body 20 that is disposed above display panel 300, transmits light, and supports first electrode 70; and movable body 40 that holds second electrode 80, transmits light, and rotates relative to support body 20. Display panel 300 emits light to at least one of support body 20 or movable body 40, and the at least one of support body 20 or movable body 40 guides the light emitted.

According to this, display panel 300 emits light to at least one of support body 20 or movable body 40, and the at least one of support body 20 or movable body 40 guides the light, and thus optical effects can be produced for input device 10.

Input device 10 includes: first electrode 70; support body 20 that supports first electrode 70; fixed body 30 fixed above support body 20; second electrode 80; movable body 40 that holds second electrode 80 in a state in which second electrode 80 faces first electrode 70 with a predetermined space being provided therebetween, movable body 40 causing second electrode 80 to approach and recede from first electrode 70 in a movement direction by rotating; operation body 50 held movably relative to fixed body 30 in a state in which operation body 50 is engaged with movable body 40, operation body 50 causing, by being operated by a user, movable body 40 to rotate; and biasing part 60 that is disposed between movable body 40 and fixed body 30, and applies, to movable body 40, a biasing force toward support body 20. Movable body 40 includes protruding and recessed structure 42 in which recesses 43 and protrusions 44 are continuously arranged in a movement direction in which movable body 40 moves, recesses 43 being recessed in a direction orthogonal to the movement direction, protrusions 44 protruding in the direction orthogonal to the movement direction. Biasing part 60 includes: elastic body 62 for applying the biasing force; sphere 63 that is provided between protruding and recessed structure 42 and elastic body 62, and elastically deforms elastic body 62 in conjunction with movement of movable body 40; and holding body 61 that is fixed on fixed body 30, and holds elastic body 62 and sphere 63, holding body 61 allowing elastic body 62 to deform and sphere 63 to move. Support body 20, fixed body 30, movable body 40, operation body 50, elastic body 62, sphere 63, and holding body 61 have light-transmitting properties.

According to this, elastic body 62, sphere 63, and holding body 61 that form a structure for giving click feelings to operation body 50 have light-transmitting properties, and thus even if no metal click spring is used, the light-transmitting property inside input device 10 can be enhanced while click feelings are achieved.

In particular, support body 20, fixed body 30, movable body 40, operation body 50, elastic body 62, sphere 63, and holding body 61 that are included in input device 10 have light-transmitting properties, and thus input device 10 can produce optical effects as a whole.

Protruding and recessed structure 42 is disposed closer to support body 20 than to holding body 61, and sphere 63 and elastic body 62 are arranged in this order on protruding and recessed structure 42.

According to this, since sphere 63 and elastic body 62 are arranged on protruding and recessed structure 42 in this order, a biasing force toward support body 20 caused by elastic body 62 can be applied to movable body 40 via sphere 63 and protruding and recessed structure 42. Thus, a biasing force toward support body 20 can be reliably applied to movable body 40.

Sphere 63 moves up and down in conjunction with moving protruding and recessed structure 42. If light is emitted onto sphere 63, diffuse reflection may occur due to the up-down movement, which may result in the occurrence of flicker. In the present embodiment, elastic body 62 is disposed outward than sphere 63, and thus flicker caused by sphere 63 can be made less noticeable. Accordingly, optical effects can be enhanced.

A portion of ground electrode 71 is disposed on the boundary portion between first region R1 and second region R2, and thus electrical interference is less likely to occur between first region R1 and second region R2. Accordingly, a change in an electrical state between first transmission electrode 721 and first reception electrode 731 and a change in an electrical state between second transmission electrode 722 and second reception electrode 732 can be accurately detected.

[Variations]

Figure 10:
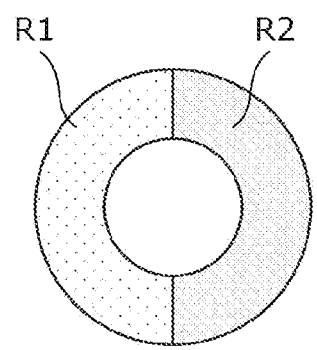
FIG. 10 illustrates explanatory drawings schematically illustrating examples of a layout of the first electrode according to the present disclosure.
Figure 10:
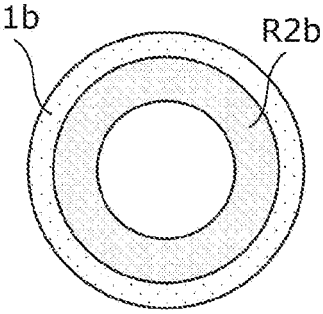
Figure 10:
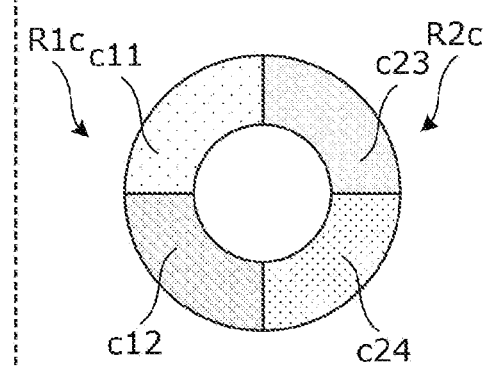
Figure 10:
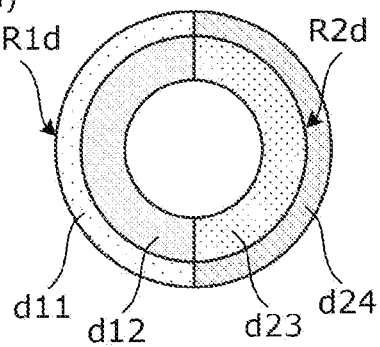

Next, variations are to be described. Note that the same signs may be assigned to the same portions as in the above embodiment, and a description thereof may be omitted. FIG. 10 is an explanatory drawing schematically illustrating an example of a layout of the first electrode according to the present disclosure. Part (a) of FIG. 10 illustrates a layout corresponding to that of first electrode 70 according to the embodiment, and first region R1 and second region R2 are half circular arcs. The layout is referred to as a first layout.

In (b) of FIG. 10, first region R1$b$ and second region R2$b$ of first electrode 70B are concentric circles. The layout is referred to as a second layout.

In (c) of FIG. 10, first region R1$c$ and second region R2$c$ of first electrode 70C are half circular arcs, and are each further equally divided into two in the circumferential direction. The regions into which first region R1$c$ is divided are first divisional region c11 and second divisional region c12, and the regions into which second region R2$c$ is divided are third divisional region c23 and fourth divisional region c24. First divisional region c11, second divisional region c12, third divisional region c23, and fourth divisional region c24 are quarter circular arcs. The layout is referred to as a third layout.

In (d) of FIG. 10, first region R1$d$ and second region R2$d$ of first electrode 70D are concentric half circles, and are each further equally divided into two in the circumferential direction. The regions into which first region R1$d$ is divided are first divisional region d11 and second divisional region d12, and the regions into which second region R2$d$ is divided are third divisional region d23 and fourth divisional region d24. First divisional region d11, second divisional region d12, third divisional region d23, and fourth divisional region d24 are half circular arcs. The layout is referred to as a fourth layout. In the following, specific examples of the second to fourth layouts are to be described.

(Variation 1)

Figure 11:
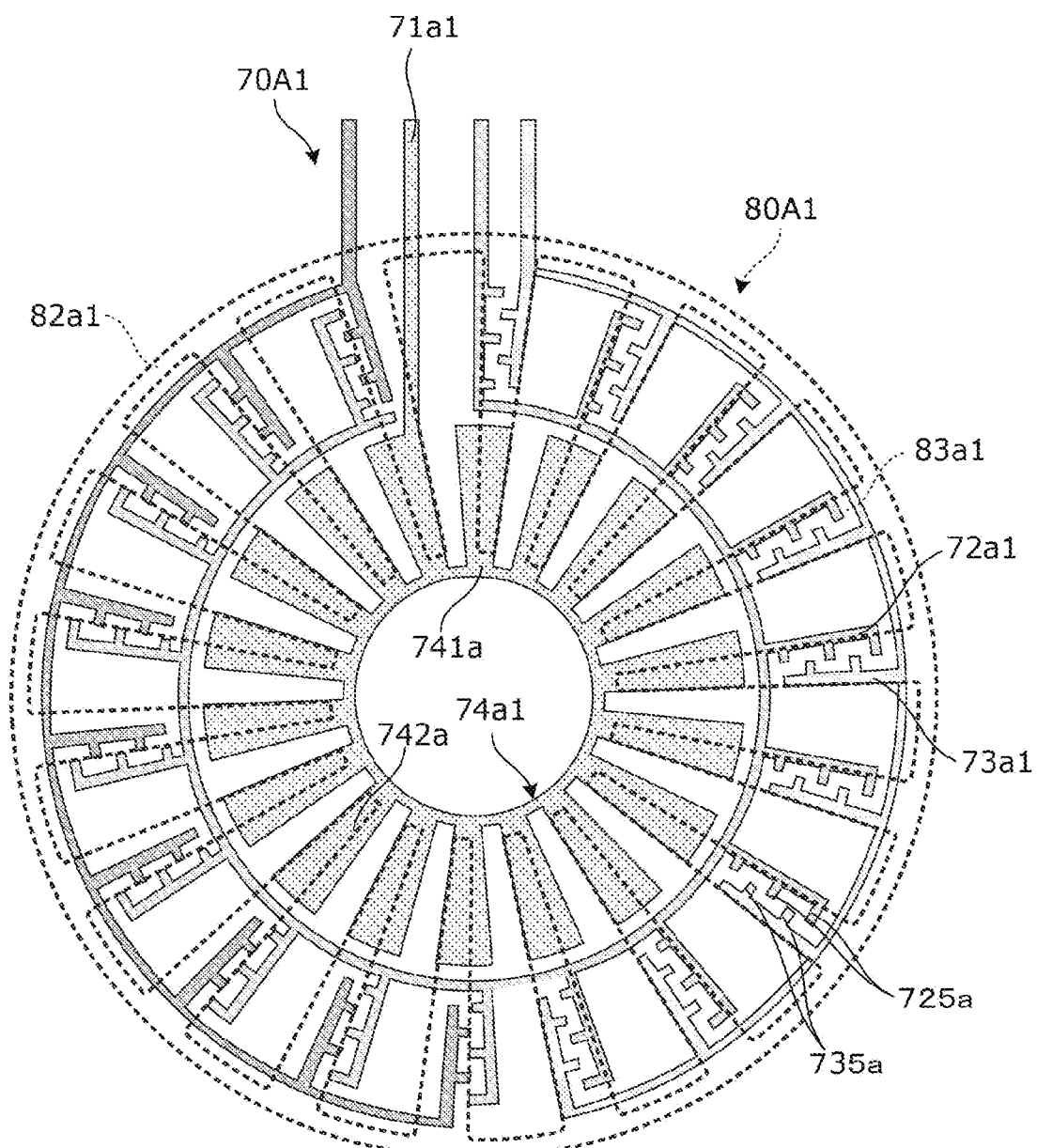
FIG. 11 is a plan view illustrating a first electrode and a second electrode according to Variation 1.

Variation 1 describes another example of the first layout. FIG. 11 is a plan view illustrating first electrode 70A1 and second electrode 80A1 according to Variation 1. FIG. 11 illustrates the external shape of second electrode 80A1 using broken lines.

The embodiment above has shown, as an example, a case in which transmission electrodes 72 and reception electrodes 73 of first electrode 70 are each formed into a stick shape. Variation 1 is to show, as an example, a case in which transmission electrodes 72$a$1 and reception electrodes 73$a$1 of first electrode 70A1 are each formed into a comb shape. Transmission electrodes 72$a$1 each include a plurality of teeth 725$a$ protruding toward reception electrode 73$a$1 paired therewith. On the other hand, reception electrodes 73$a$1 each include a plurality of teeth 735$a$ protruding toward transmission electrode 72$a$1 paired therewith. Teeth 725$a$ and teeth 735$a$ are alternately arranged in the radial direction, being spaced apart from one another.

Accordingly, transmission electrodes 72$a$1 and reception electrodes 73$a$1 each have a comb shape.

According to this, transmission electrodes 72$a$1 and reception electrodes 73$a$1 each have a comb shape, and thus capacitance can be ensured by increasing the area as compared with the case of the stick shape while sensitivity is increased by increasing the space between transmission electrodes 72$a$1 and reception electrodes 73$a$1.

The above embodiment has shown, as an example, a case where ground electrode 71 always faces a portion of second electrode 80. However, as in Variation 1, ground electrode 71$a$1 may face a portion of second electrode 80A1 when second electrode 80A1 approaches at least one set of transmission electrode 72$a$1 and reception electrode 73$a$1.

To give a more specific description, in Variation 1, first ground electrode 74$a$1 of ground electrode 71$a$1 includes inner ring 741$a$ and a plurality of extending portions 742$a$. Extending portions 742$a$ extend radially from the outer circumferential edge of inner ring 741$a$. Extending portions 742$a$ are disposed at equal intervals in the circumferential direction, and are each formed into substantially a fan shape. Each of extending portions 742$a$ is disposed in a position corresponding to one set of transmission electrode 72$a$1 and reception electrode 73$a$1 in the circumferential direction.

Second electrode 80A1 includes outer ring portion 82$a$1, and a plurality of connected portions 83$a$1. Outer ring portion 82$a$1 is a portion formed into a substantially ring shape, and is disposed, surrounding first electrode 70A1 in a plan view. Connected portions 83$a$1 are portions connected to the inner circumferential edge of outer ring portion 82$a$1 and arranged at equal intervals in the circumferential direction. Connected portions 83$a$1 radially extend such that tips thereof are in the vicinity of inner ring 741$a$ of first ground electrode 74$a$1. The number of connected portions 83$a$1 provided is the same as the number of extending portions 742$a$. The width of connected portion 83$a$1 in the circumferential direction is narrower than the width of extending portion 742$a$. The width of connected portion 83$a$1 in the circumferential direction is set to a width that overlaps extending portion 742$a$ when connected portion 83$a$1 partially overlaps transmission electrode 72$a$1 and reception electrode 73$a$1 that are paired in a plan view. In this manner, during rotation, ground electrode 71$a$1 faces a portion of second electrode 80A1 when connected portion 83$a$1 of second electrode 80A1 approaches at least one set of transmission electrode 72$a$1 and reception electrode 73$a$1.

(Variation 2)

Figure 12:
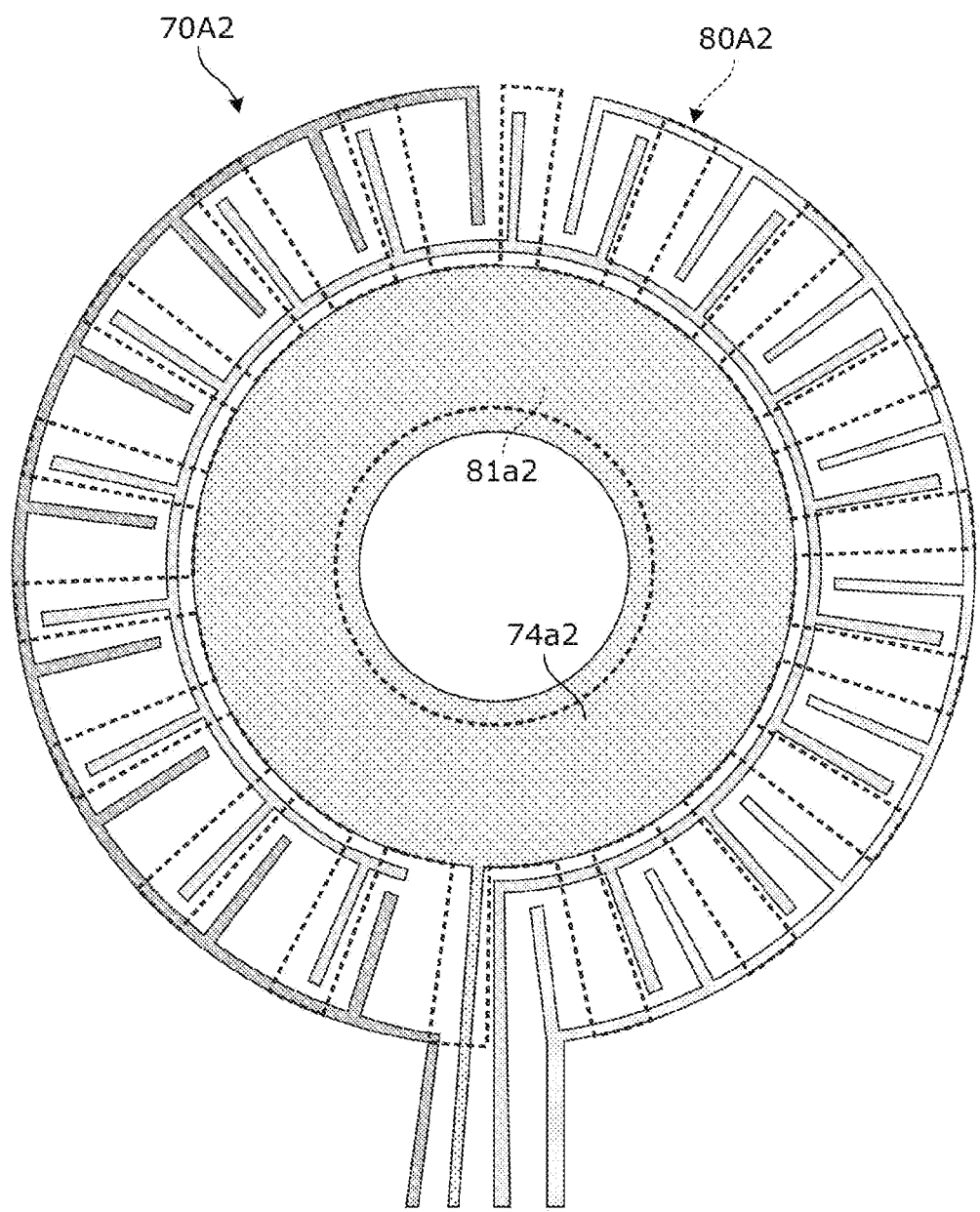
FIG. 12 is a plan view illustrating a first electrode and a second electrode according to Variation 2.

Variation 2 describes another example of the first layout. FIG. 12 is a plan view illustrating first electrode 70A2 and second electrode 80A2 according to Variation 2. FIG. 12 illustrates the external shape of second electrode 80A2 using broken lines.

The embodiment above has shown an example of a case in which first ground electrode 74 of first electrode 70 is formed into a substantially circular shape. Variation 2 shows an example of a case in which first ground electrode 74$a$2 of first electrode 70A2 is formed into a substantially annular shape. In this case, circular portion 81$a$2 of second electrode 80A2 is also formed into a substantially annular shape. The inside diameter of first ground electrode 74$a$2 is smaller than the inside diameter of circular portion 81$a$2. Further, second electrode 80A2 does not include an outer ring portion.

(Variation 3)

Figure 13:
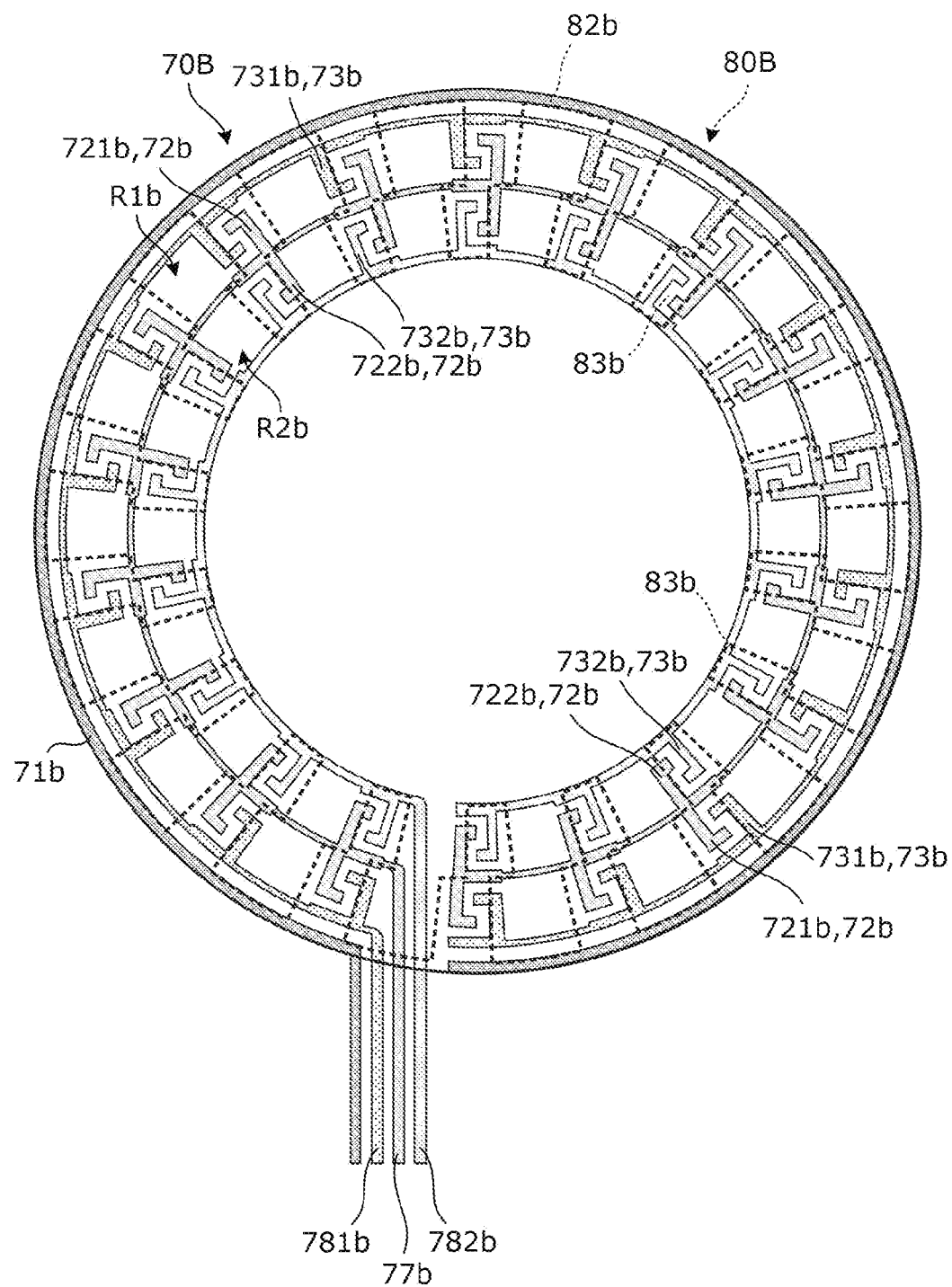
FIG. 13 is a plan view illustrating a first electrode and a second electrode according to Variation 3.

Variation 3 describes a specific example of the second layout. FIG. 13 is a plan view illustrating first electrode 70B and second electrode 80B according to Variation 3. FIG. 13 illustrates the external shape of second electrode 80B using broken lines.

As illustrated in FIG. 13, first electrode 70B includes ground electrode 71b, and at least two sets each including transmission electrode 72b and reception electrode 73b.

Ground electrode 71b is formed into a substantially circular shape, so as to surround each set of transmission electrode 72b and reception electrode 73b. Inside of ground electrode 71b, an annular portion of the outer circumferential portion is first region R1b, and an annular portion of the inner circumferential portion is second region R2b.

Transmission conductive pattern 77b that includes transmission electrodes 72b in the sets is disposed along the inner circumference of ground electrode 71b within first region R1b and second region R2b. Transmission conductive pattern 77b includes transmission electrodes 72b extending radially and disposed at positions in the circumferential direction. Transmission electrodes 72b are disposed at equal intervals in the circumferential direction. Each of transmission electrodes 72b has a stick shape that radially extends, and includes both end portions bent in the circumferential direction. In each of transmission electrodes 72b, a portion disposed in first region R1b is first transmission electrode 721b, and a portion disposed in second region R2b is second transmission electrode 722b.

A pair of reception conductive patterns 781b and 782b that include reception electrodes 73b in the sets are each disposed along the inner circumference of ground electrode 71b. Out of the pair of reception conductive patterns 781b and 782b, reception conductive pattern 781b that is one of the pair is disposed in first region R1b, and reception conductive pattern 782b that is the other of the pair is disposed in second region R2b. Reception conductive pattern 781b that is the one of the pair and reception conductive pattern 782b that is the other of the pair include reception electrodes 73b disposed radially and arranged at positions in the circumferential direction. Each of reception electrodes 73b is formed into a stick shape that radially extends, and includes an end portion bent in the circumferential direction. In the following, out of reception electrodes 73b, reception electrodes 73b disposed in first region R1b may each be referred to as first reception electrode 731b, and reception electrodes 73b disposed in second region R2b may each be referred to as second reception electrode 732b. First reception electrodes 731b and second reception electrodes 732b are disposed in the same positions in the circumferential direction. Accordingly, each of first reception electrodes 731b and each of second reception electrodes 732b face first transmission electrode 721b and second transmission electrode 722b that are paired with first reception electrode 731b and second reception electrode 732b, with a certain space being provided therebetween in the circumferential direction.

Second electrode 80B includes outer ring portion 82b and a plurality of connected portions 83b. Outer ring portion 82b is a portion formed into a substantially annular shape, and overlaps ground electrode 71b substantially entirely in a plan view. Connected portions 83b are portions connected to the inner circumferential edge of outer ring portion 82b and arranged at equal intervals in the circumferential direction. Connected portions 83b each include a step shape such that a portion corresponding to first region R1b and a portion corresponding to second region R2b are displaced in the circumferential direction. In this manner, during rotation of connected portions 83b, a phase for each set of first transmission electrode 721b and first reception electrode 731b, and a phase for each set of second transmission electrode 722b and second reception electrode 732b are different from each other.

(Variation 4)

Figure 14:
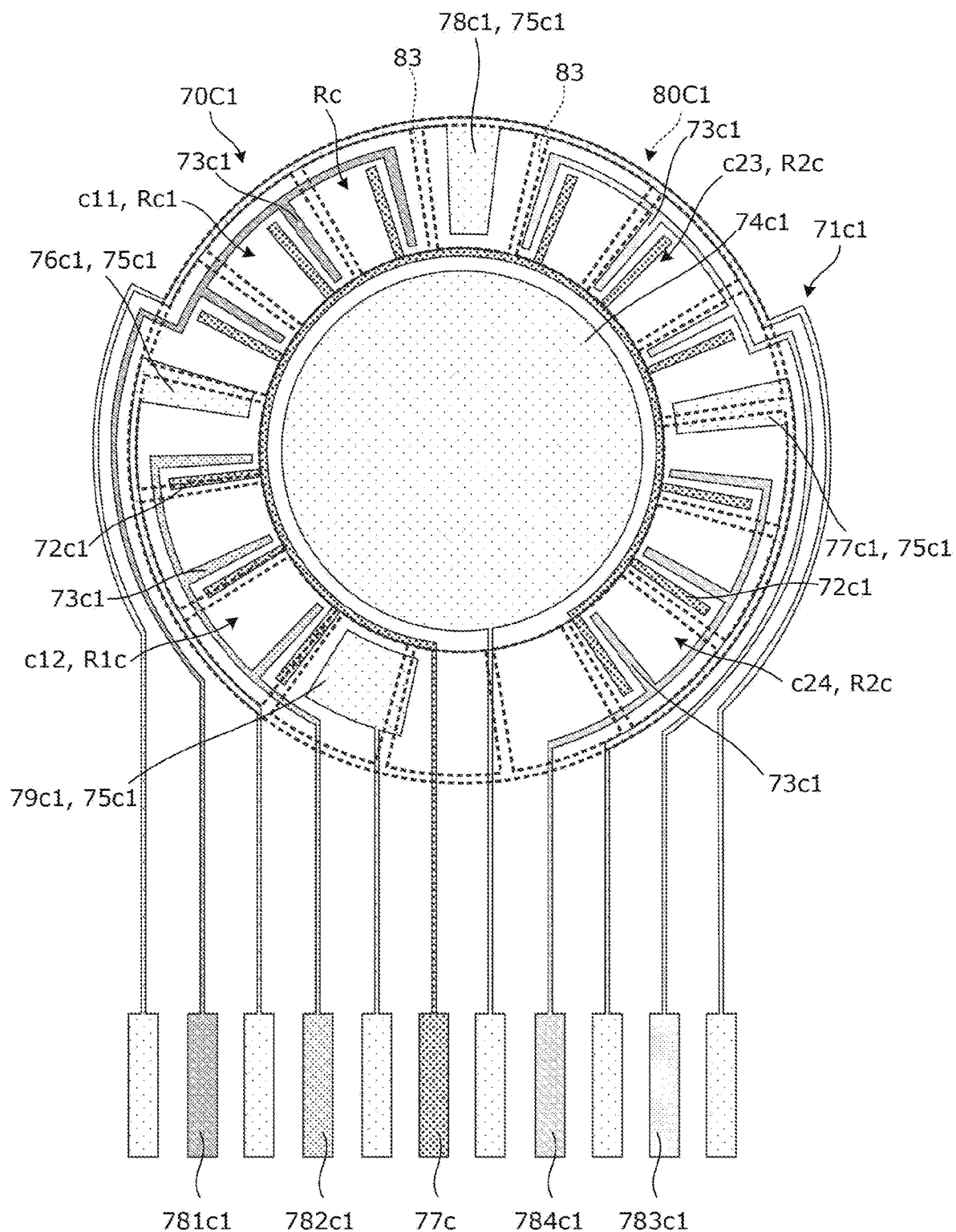
FIG. 14 is a plan view illustrating a first electrode and a second electrode according to Variation 4.

Variation 4 describes a specific example of the third layout. FIG. 14 is a plan view illustrating first electrode 70C1 and second electrode 80C1 according to Variation 4. FIG. 14 illustrates the external shape of second electrode 80C1 using broken lines. Second electrode 80C1 differs from second electrode 80 according to the embodiment in that the number of connected portions 83 provided is less than that of second electrode 80. Specifically, connected portions 83 included in second electrode 80C1 are half of connected portions 83 included in second electrode 80 according to the embodiment. Specifically, the number of connected portions 83 included in second electrode 80C1 is 16. Accordingly, the space between each adjacent pair of connected portions 83 in the circumferential direction is wider than that of second electrode 80 according to the embodiment.

First electrode 70C1 includes ground electrode 71c1, and at least two sets each including transmission electrode 72c1 and reception electrode 73c1.

Ground electrode 71c1 includes first ground electrode 74c1 and second ground electrode 75c1. First ground electrode 74c1 is formed into a substantially circular shape. An annular region surrounding first ground electrode 74c1 is region Rc. Region Rc is partitioned into first region R1c and second region R2c. Furthermore, first region R1c is partitioned into first divisional region c11 and second divisional region c12 by being equally divided into two in the circumferential direction. Second region R2c is partitioned into third divisional region c23 and fourth divisional region c24 by being equally divided into two in the circumferential direction.

Second ground electrode 75c1 includes a plurality of divisional ground electrodes. The plurality of divisional ground electrodes are first divisional ground electrode 76c1, second divisional ground electrode 77c1 third divisional region 78c1, and fourth divisional region 79c1.

First divisional ground electrode 76c1 extends so as to partially overlap outer ring portion 82 of second electrode 80C1 in a plan view, and includes a tip portion disposed at a boundary between first divisional region c11 and second divisional region c12.

Second divisional ground electrode 77c1 extends so as to partially overlap outer ring portion 82 of second electrode 80C1 in a plan view, and includes a tip portion disposed at a boundary between third divisional region c23 and fourth divisional region c24.

Third divisional ground electrode 78c1 extends so as to partially overlap outer ring portion 82 of second electrode 80C1 in a plan view, and includes a tip portion disposed at a boundary between first divisional region c11 and third divisional region c23.

Fourth divisional ground electrode 79c1 includes an edge portion disposed at a boundary between second divisional region c12 and fourth divisional region c24.

As described above, a portion of ground electrode 71c1 is disposed at each boundary portion, and thus electrical interference is unlikely to occur between adjacent ones of the divisional regions.

A plurality of sets each including transmission electrode 72c1 and reception electrode 73c1 are disposed in region Rc.

Specifically, transmission conductive pattern 77c that includes transmission electrodes 72c1 in the sets is disposed along the outer circumference of first ground electrode 74c1 in region Rc. Transmission conductive pattern 77c includes transmission electrodes 72c1 extending radially and disposed at positions in the circumferential direction. Transmission electrodes 72c1 are each formed into a stick shape extending outward.

Four reception conductive patterns 781c1, 782c1, 783c1, and 784c1 that include reception electrodes 73c1 in the sets are disposed on the outer side than transmission conductive pattern 77c in region Rc. Reception conductive pattern 781c1 includes a plurality of reception electrodes 73c1 disposed in first divisional region c11. Reception conductive pattern 782c1 includes a plurality of reception electrodes 73c1 disposed in second divisional region c12. Reception conductive pattern 783c1 includes a plurality of reception electrodes 73c1 disposed in third divisional region c23. Reception conductive pattern 784c1 includes a plurality of reception electrodes 73c1 disposed in fourth divisional region c24.

Three sets each including transmission electrode 72c1 and reception electrode 73c1 are disposed in each of the divisional regions. As compared to the above embodiment, transmission electrodes 72c1 and reception electrodes 73c1 are thinned out, and thus the space between adjacent ones of the sets is increased. A plurality of sets each including transmission electrode 72c1 and reception electrode 73c1 in one of the divisional regions are disposed so as to have a topology different from topologies of pluralities of sets each including transmission electrode 72c1 and reception electrode 73c1 in the other divisional regions, in the circumferential direction. Accordingly, changes in capacitance between (i) connected portions 83 of second electrode 80C1 and (ii) transmission electrodes 72c1 and reception electrodes 73c1 in the divisional regions during rotation have phase differences.

Figure 15:
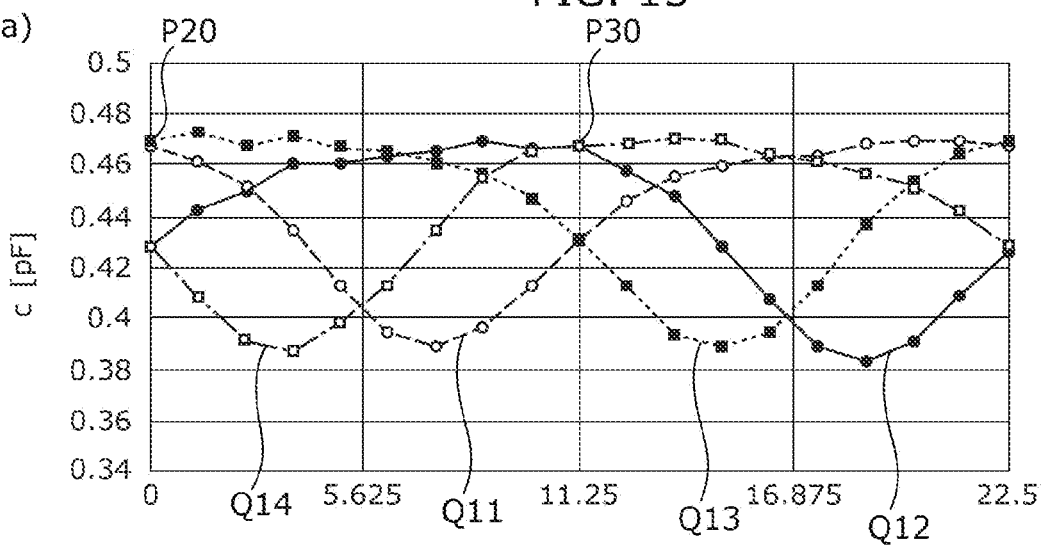
FIG. 15 illustrates explanatory drawings for describing detection of an amount of movement of the input device according to Variation 4.
Figure 15:
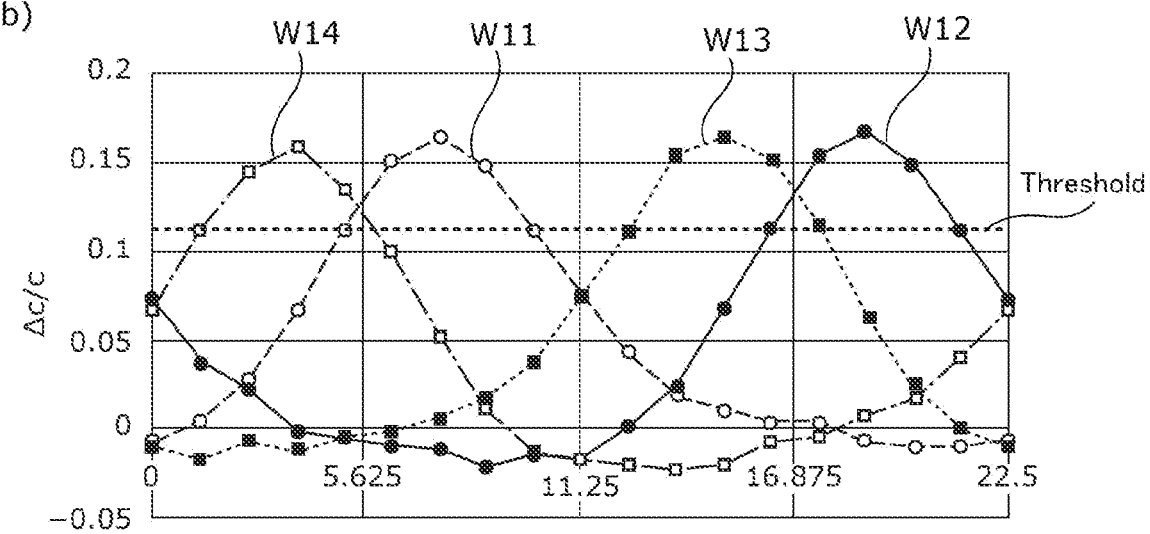
Figure 15:
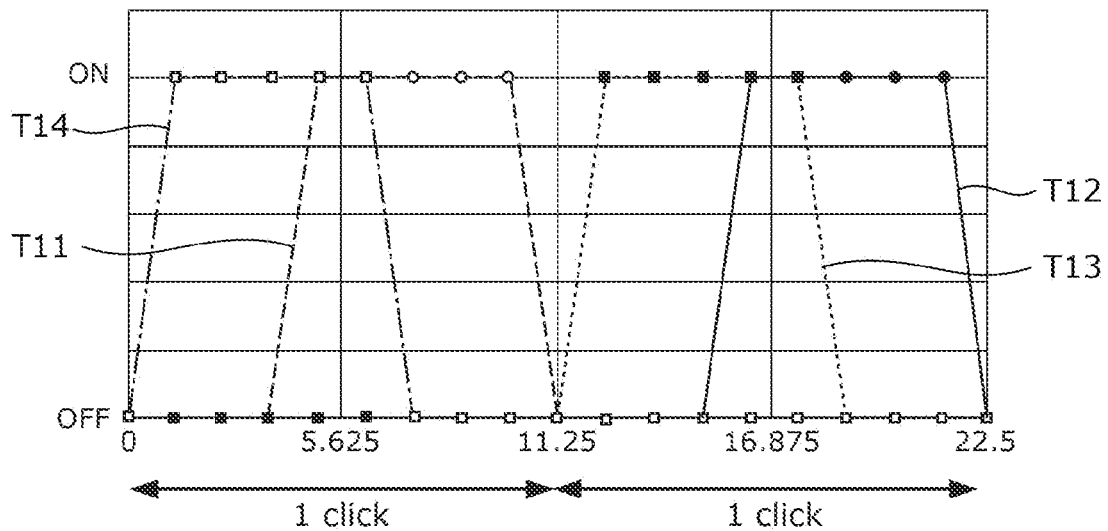

FIG. 15 illustrates explanatory drawings for describing detection of an amount of movement of the input device according to Variation 4. Part (a) of FIG. 15 illustrates changes in capacitance of first electrode 70C1 and second electrode 80C1 during rotation. Specifically, a change in capacitance caused by connected portions 83 and transmission electrodes 72c1 and reception electrodes 73c1 in the sets in first divisional region c11 is referred to as first capacitance change Q11. A change in capacitance caused by connected portions 83 and transmission electrodes 72c1 and reception electrodes 73c1 in the sets in second divisional region c12 is referred to as second capacitance change Q12. A change in capacitance caused by connected portions 83 and transmission electrodes 72c1 and reception electrodes 73c1 in the sets in third divisional region c23 is referred to as third capacitance change Q13. A change in capacitance caused by connected portions 83 and transmission electrodes 72c1 and reception electrodes 73c1 in the sets in fourth divisional region c24 is referred to as fourth capacitance change Q14.

Here, point P20 and point P30 are each set to a mechanical operation origin of input device 10 in (a) of FIG. 15. Point P20 and point P30 correspond to the second state. Point 20 is in the vicinity of an intersection of first capacitance change Q11 and third capacitance change Q13, and point 30 is in the vicinity of an intersection of second capacitance change Q12 and fourth capacitance change Q14.

Part (b) of FIG. 15 illustrates changes in electrical states during rotation. Here, an electrical state refers to an amount of change in each of first capacitance change Q11 to fourth capacitance change Q14. The amounts of change are input to controller 90 as electrical signals. In (b) of FIG. 15, the waveform of a capacitance change rate of first capacitance change Q11 is first waveform W11, the waveform of a capacitance change rate of second capacitance change Q12 is second waveform W12, the waveform of a capacitance change rate of third capacitance change Q13 is third waveform W13, and the waveform of a capacitance change rate of fourth capacitance change Q14 is fourth waveform W14. As described above, as compared with the above embodiment, the space between two adjacent sets in the circumferential direction is increased, and thus a change amount can be increased. Accordingly, the accuracy of position detection can be increased.

Controller 90 distinguishes, for each of first waveform W11 to fourth waveform W14, a portion having a value greater than or equal to a predetermined threshold as an ON signal from a portion having a value less than the predetermined threshold as an OFF signal. The distinguishing results are shown in (c) of FIG. 15. Part (c) of FIG. 15 illustrates distinguishing result T11 for first waveform W11, distinguishing result T12 for second waveform W12, distinguishing result T13 for third waveform W13, and distinguishing result T14 for fourth waveform W14.

At operation origin (point P20), first waveform W11 to fourth waveform W14 are all on the negative side relative to a predetermined threshold, and thus distinguishing results T11 to T14 all show an OFF signal at point P20. Controller 90 considers, for each of first waveform W11 and third waveform W13, a portion that is an ON signal to be an amount of movement per unit. In the present embodiment, the amount of movement per unit is an amount of movement for one click.

At operation origin (point P30), first waveform W11 to fourth waveform W14 are all on the negative side relative to the predetermined threshold, and thus distinguishing results T11 to T14 all show an OFF signal at point P30. Controller 90 considers, for each of second waveform W12 and fourth waveform W14, a portion that is an ON signal to be an amount of movement for one click.

Also in this case, controller 90 can determine "normal rotation" and "reverse rotation", based on the order in which the waveforms appear within an amount of movement per unit.

(Variation 5)

Figure 16:
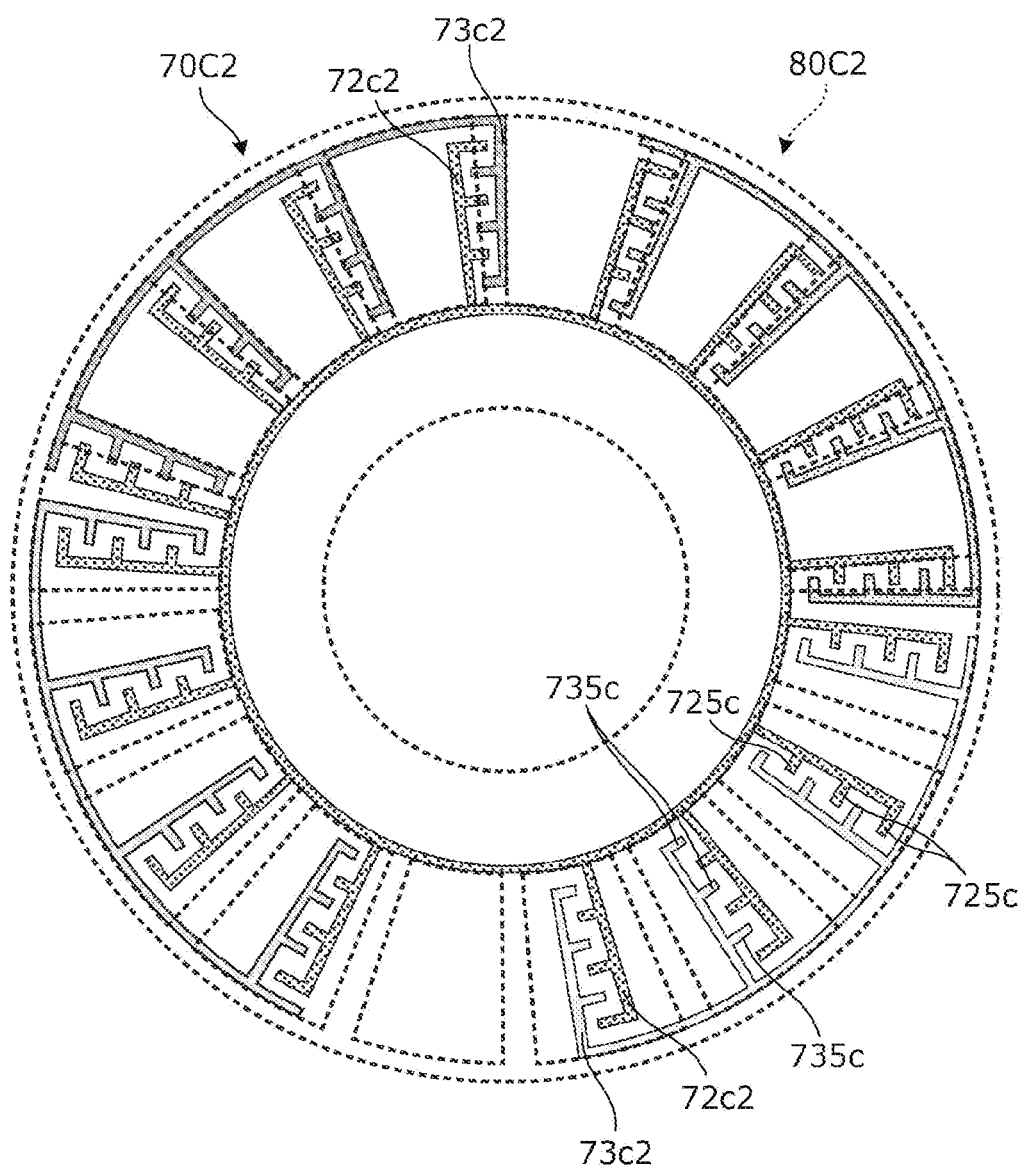
FIG. 16 is a plan view illustrating a first electrode and a second electrode according to Variation 5.

Variation 5 describes another example of the third layout. FIG. 16 is a plan view illustrating first electrode 70C2 and second electrode 80C2 according to Variation 5. FIG. 16 omits illustration of the ground electrode of first electrode 70C2. FIG. 16 illustrates the external shape of second electrode 80C2 using broken lines. Second electrode 80C2 differs from second electrode 80C1 according to Variation 4 in that an opening is provided in a center portion. Further, transmission electrodes 72c2 and reception electrodes 73c2 according to Variation 4 are each formed into a comb shape. Specifically, transmission electrodes 72c2 each include a plurality of teeth 725c protruding toward reception electrode 73c2 paired therewith. On the other hand, reception electrodes 73c2 each include a plurality of teeth 735c protruding toward transmission electrode 72c2 paired therewith. Teeth 725c and teeth 735c are alternately arranged in the radial direction, being spaced apart from one another. In this manner, transmission electrodes 72c2 and reception electrodes 73c2 each have a comb shape, and thus capacitance can be ensured by increasing the area as compared with the case of the stick shape while sensitivity is increase by increasing the space between transmission electrodes 72*c*2 and reception electrodes 73*c*2.

(Variation 6)

Figure 17:
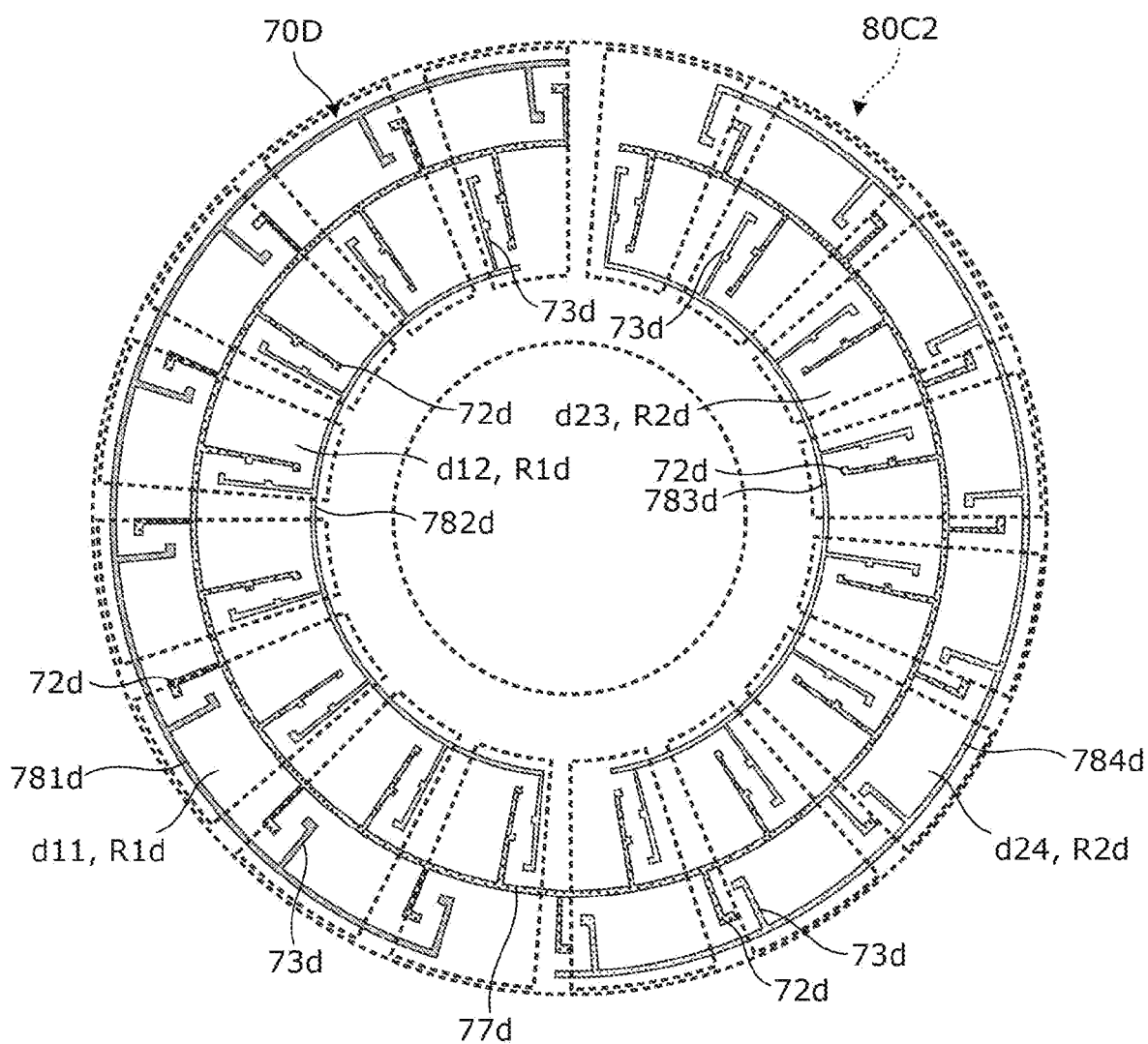
FIG. 17 is a plan view illustrating a first electrode and a second electrode according to Variation 6.

Variation 6 describes a specific example of the fourth layout. FIG. 17 is a plan view illustrating first electrode 70D and second electrode 80C2 according to Variation 6. FIG. 17 omits illustration of the ground electrode of first electrode 70D. FIG. 17 illustrates the external shape of second electrode 80C2 using broken lines.

As illustrated in FIG. 17, first electrode 70D includes at least two sets each including transmission electrode 72*d* and reception electrode 73*d*.

Transmission conductive pattern 77*d* that includes transmission electrodes 72*d* in the sets is disposed substantially annually in first region R1*d* and second region R2*d*. Transmission conductive pattern 77*d* includes transmission electrodes 72*d* in the circumferential direction to form double rings.

Four reception conductive patterns 781*d*, 782*d*, 783*d*, and 784*d* that include reception electrodes 73*d* in the sets are disposed in the circumferential direction. Specifically, reception conductive pattern 781*d* is disposed in first divisional region d11, reception conductive pattern 782*d* is disposed in second divisional region d12, reception conductive pattern 783*d* is disposed in third divisional region d23, and reception conductive pattern 784*d* is disposed in fourth divisional region d24.

A plurality of sets each including transmission electrode 72*d* and reception electrode 73*d* in one of the divisional regions are disposed so as to have a topology different from topologies of pluralities of sets each including transmission electrode 72*d* and reception electrode 73*d* in the other divisional regions, in the circumferential direction. Accordingly, changes in capacitance between (i) connected portions 83 of second electrode 80C2 and (ii) transmission electrodes 72*d* and reception electrodes 73*d* in each divisional region during rotation have phase differences.

[Others]

The above has described the input device according to the present disclosure, based on the embodiment and the variations, yet the present disclosure is not limited to the embodiment and the variations.

For example, in the embodiment, rotational type input device 10 has been shown as an example, yet input device 10 may be a translatory movement type device. In this case, at least two sets each including a transmission electrode and a reception electrode are arranged on a straight line, and the second electrode moves in a translatory manner, to approach and recede from the at least two sets each including the transmission electrode and the reception electrode. In this case, the operation body and the movable body also move in a translatory manner.

In the above embodiment, sphere 63 has been shown as an example, as a pressing body that elastically deforms elastic body 62 in conjunction with the movement of movable body 40. However, the pressing body may have any shape as long as it rolls or slides on the protruding and recessed structure. Other shapes of the pressing body include a circular cylinder, an elliptic cylinder, a cylindroid, and an American football shape, for instance. Note that a portion of the pressing body that comes into contact with the protruding and recessed structure is preferably has a curve that swells out in a direction protruding toward the protruding and recessed structure. Note that the shape of a portion of the pressing body that comes into contact with the protruding and recessed structure is a spherical shape, for example.

The above embodiment has shown an example in which support body 20, fixed body 30, movable body 40, operation body 50, biasing part 60, first electrode 70, and second electrode 80 all have light-transmitting properties, yet at least one of the members may have a light-transmitting property. In particular, if optical effects are unnecessary for the input device, all the members may not have light-transmitting properties. For example, the biasing part may include a click spring made of a metal plate. Also in this case, the first electrode supported by the support body can be pressed against the second electrode held by the movable body.

Further, the ground electrode (reference potential electrode) may not face a portion of the second electrode when the second electrode does not approach at least one set of a transmission electrode and a reception electrode.

Further, the ground electrode (reference potential electrode) may face a portion of the second electrode when the second electrode does not approach at least one set of a transmission electrode and a reception electrode.

Further, an area of the portion of the second electrode that the ground electrode (reference potential electrode) faces may increase when the second electrode approaches at least one set of a transmission electrode and a reception electrode.

The present disclosure includes an embodiment obtained by making various modifications that those skilled in the art could think of, to the embodiment, or an embodiment obtained by a given combination of elements and functions in the embodiment and the variations without departing from the scope of the present disclosure.

INDUSTRIAL APPLICABILITY

The present disclosure is useful in an input device that detects an amount of a rotational movement or a slide movement, for example, and outputs a signal based on the amount of movement.

REFERENCE SIGNS LIST 10 input device
20 support body
21 cover lens
30 fixed body
31, 45 notch
32 circular protrusion
40 movable body
41 brim portion
42 protruding and recessed structure
43 recess
44 protrusion
50 operation body
51 top plate portion
52 protruding portion
53 claw portion
60 biasing part
61 holding body
62 elastic body
63 sphere (pressing body)
64 clearance portion
70, 70A1, 70A2, 70B, 70C1, 70C2, 70D first electrode
71, 71*a*1, 71*b*, 71*c*1 ground electrode (reference potential electrode)
72, 72*a*1, 72*b*, 72*c*1, 72*c*2, 72*d* transmission electrode
73, 73*a*1, 73*b*, 73*c*1, 73*c*2, 73*d* reception electrode
74, 74*a*1, 74*a*2, 74*c*1 first ground electrode (first reference potential electrode)

75, 75c1 second ground electrode (second reference potential electrode)
76c1 first divisional ground electrode
77, 77b, 77c, 77d transmission conductive pattern
77c1 second divisional ground electrode
78c1 third divisional ground electrode
79c1 fourth divisional ground electrode
80, 80A1, 80A2, 80B, 80C1, 80C2 second electrode
81, 81a2 circular portion
82, 82a1, 82b outer ring portion
83, 83a1, 83b connected portion
90 controller
200 touch sensor
300 display panel (image display)
400 shielding layer
511 inner circumferential portion
512 outer circumferential portion
611 projection
612 slit
721, 721b first transmission electrode
722, 722b second transmission electrode
725a, 725c, 735b, 735c tooth
731, 731b first reception electrode
732, 732b second reception electrode
741a inner ring
742a extending portion
781, 781b, 781c1, 781d, 782, 782b, 782c1, 782d, 783c1, 783d, 784c1, 784d reception conductive pattern
c11, d11 first divisional region
c12, d12 second divisional region
c23, d23 third divisional region
c24, d24 fourth divisional region
H space
L1 distance
L2 distance
P10, P11, P12, P19, P20, P21, P22, P30 point
Q1, Q11 first capacitance change
Q2, Q12 second capacitance change
Q13 third capacitance change
Q14 fourth capacitance change
R, Rc region
R1, R1b, R1c, R1d first region
R2, R2b, R2c, R2d second region
S1, S2 overlapping area
T1, T2, T11, T12, T13, T14 distinguishing result
W space
W1, W11 first waveform
W2, W12 second waveform
W13 third waveform
W14 fourth waveform
α angle
β angle

The invention claimed is:

1. An input device comprising:
a first electrode;
a support body that supports the first electrode;
a fixed body fixed above the support body;
a second electrode;
a movable body that holds the second electrode in a state in which the second electrode faces the first electrode with a predetermined space being provided therebetween, the movable body causing the second electrode to approach and recede from the first electrode by moving by rotation or translation;
an operation body held by the fixed body movably relative to the fixed body in a state in which the operation body is engaged with the movable body, the operation body causing, by being operated by a user, the movable body to move by rotation or translation; and
a biasing part that is disposed between the movable body and the fixed body, and applies, to the movable body, a biasing force toward the support body,
wherein the movable body includes a protruding and recessed structure in which a plurality of recesses and a plurality of protrusions are continuously and alternately arranged in a movement direction in which the movable body moves, the plurality of recesses being recessed in a direction orthogonal to the movement direction, the plurality of protrusions protruding in the direction orthogonal to the movement direction, and
the biasing part includes:
an elastic body for applying the biasing force;
a pressing body that is provided between the protruding and recessed structure and the elastic body in a direction perpendicular to an upper surface of the support body, and elastically deforms the elastic body in conjunction with movement of the movable body; and
a holding body that is fixed on the fixed body, and holds the elastic body and the pressing body, the holding body allowing the elastic body to deform and the pressing body to move.

2. The input device according to claim 1, wherein an operational force applied from the operation body while the movable body is moving and the biasing force applied from the biasing part are applied to the movable body at different positions.

3. The input device according to claim 1,
wherein the holding body includes a clearance portion in which the elastic body elastically deforms, the clearance portion having a recessed shape, and
the clearance portion is provided in a portion of the holding body across the elastic body from the pressing body.

4. The input device according to claim 1, wherein a portion of the pressing body that comes into contact with the protruding and recessed structure has a curve that swells out toward the protruding and recessed structure.

5. The input device according to claim 1, wherein the pressing body is a sphere.

6. The input device according to claim 1,
wherein the movable body and the operation body rotate about a rotation center, and
the biasing part applies the biasing force to the movable body from each of a pair of positions that overlap an outer circumferential portion of the movable body, the pair of positions having the rotation center of the movable body located therebetween.

7. The input device according to claim 1, wherein the biasing part includes a click spring made of a metal plate.

8. The input device according to claim 1,
wherein the first electrode includes a reference potential electrode, and two or more sets each including a transmission electrode and a reception electrode,
the reference potential electrode faces at least a portion of the second electrode as a result of the second electrode approaching at least one set of a transmission electrode and a reception electrode out of the two or more sets,
the two or more sets include:
a first set of a transmission electrode and a reception electrode, the first set being disposed in a first region; and a second set of a transmission electrode and a reception electrode, the second set being disposed in a second region, and a phase when the first set approaches and recedes from the second electrode is different from a phase when the second set approaches and recedes from the second electrode.

9. The input device according to claim 8, wherein the reference potential electrode does not face a portion of the second electrode when the second electrode does not approach the at least one set.

10. The input device according to claim 8, wherein the reference potential electrode faces a portion of the second electrode when the second electrode does not approach the at least one set.

11. The input device according to claim 10, wherein an area of the portion of the second electrode that the reference potential electrode faces increases when the second electrode approaches the at least one set.

* * * * *